(12) United States Patent
Ina et al.

(10) Patent No.: US 6,636,311 B1
(45) Date of Patent: Oct. 21, 2003

(54) ALIGNMENT METHOD AND EXPOSURE APPARATUS USING THE SAME

(75) Inventors: Hideki Ina, Yokohama (JP); Minoru Yoshii, Tokyo (JP); Masanobu Hasegawa, Utsunomiya (JP); Takashi Satoh, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/450,682

(22) Filed: Nov. 30, 1999

(30) Foreign Application Priority Data

Dec. 1, 1998 (JP) ............ 10-356940
Nov. 18, 1999 (JP) ............ 11-328055

(51) Int. Cl.⁷ ............................ G01B 11/00
(52) U.S. Cl. ............................ 356/401; 356/399
(58) Field of Search ............... 356/401, 399, 356/600, 601

(56) References Cited

U.S. PATENT DOCUMENTS 4,886,974 A  12/1989  Ina ................... 250/561
5,117,255 A * 5/1992  Shiraishi et al. ........ 355/53
5,309,197 A * 5/1994  Mori et al. ............ 355/53
5,461,474 A  10/1995  Yoshii et al. ......... 356/237
5,777,744 A  7/1998  Yoshii et al. ......... 356/372

FOREIGN PATENT DOCUMENTS

| JP | 63-32303   | 2/1988 |
| JP | 2-130908   | 5/1990 |
| JP | 5-217861   | 8/1993 |
| JP | 9-115815   | 5/1997 |
| JP | 2735632    | 1/1998 |

* cited by examiner

*Primary Examiner*—Frank G. Font
*Assistant Examiner*—Roy M Punnoose
(74) *Attorney, Agent, or Firm*—Fitzpatrick, Cella, Harper & Scinto

(57) ABSTRACT

An alignment method for aligning first and second objects, in an exposure apparatus for transferring a pattern of the first object onto the second object as being coated with a resist, includes a process of producing an alignment offset value related to an alignment mark forming region on the second object, after formation of the resist coating thereon, and a process of aligning the first object with the second object as being coated with the resist, in the exposure apparatus, on the basis of the offset value as produced.

5 Claims, 15 Drawing Sheets

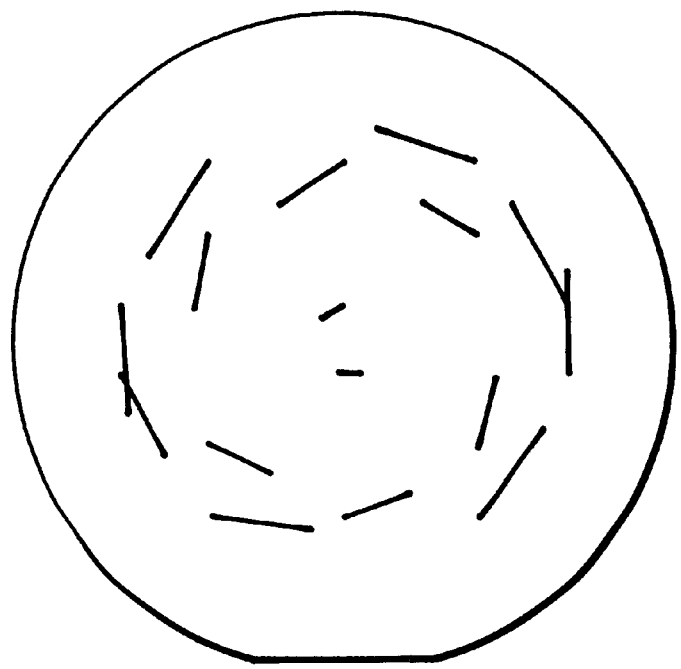
FIG. IA
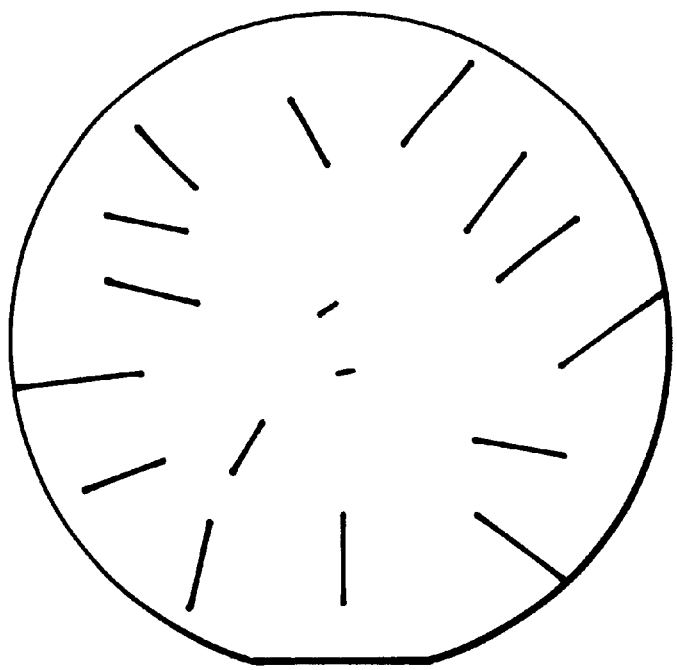
FIG. IB

ALIGNMENT METHOD AND EXPOSURE APPARATUS USING THE SAME

FIELD OF THE INVENTION AND RELATED ART

This invention relates to an alignment method and an exposure apparatus using the same, usable in the manufacture of semiconductor devices, for example, for relatively aligning a fine electronic circuit pattern, such as ICs, LSIs or VLSIs, formed on the surface of a reticle (first object), with a wafer (second object). More specifically, the invention is concerned with an alignment method and an exposure apparatus particularly effectively arranged to perform an alignment operation in a situation wherein a WIS (Wafer Induced Shift), which is a wafer process error, occurs easily.

Projection exposure apparatuses for semiconductor manufacture should have a performance for projecting a circuit pattern of a reticle onto a wafer at a higher resolution, to meet further increases in the density of an integrated circuit. The projection resolving power for a circuit pattern can be increased by enlarging the numerical aperture (NA) of a projection lens while keeping the wavelength of exposure light fixed, or by shifting the exposure light to a shorter wavelength, e.g., from g-line to i-line or from i-line to an excimer laser, for example.

On the other hand, with further miniaturization of a circuit pattern, the requirement for high-precision alignment between a reticle, having an electronic circuit pattern formed thereon, and a wafer has become more strict.

In the reticle-to-wafer alignment, there are cases using exposure light with which a resist applied to the wafer surface is sensitive and cases using non-exposure light (e.g., 633 nm wavelength from a He—Ne laser) not sensitizing the wafer resist. Currently, in most cases, non-exposure light is used in practice. This is because of the advantage that non-exposure light is less influenced by semiconductor manufacturing processes. Particularly, since the transmission factor of the resist is high, wafers can be observed independently of the resist characteristic.

The assignee of the subject application has proposed alignment systems using non-exposure light, such as in Japanese Patent Application Laid-Open No. 32303/1988 and Japanese Patent Application Laid-Open No. 130908/1990.

The alignment technique such as above is called a non-exposure light TTL off-axis system, and in such a system, chromatic aberration to be caused as non-exposure light passes a projection optical system, for projecting a reticle pattern onto a wafer, is corrected by an alignment optical system.

In most alignment methods currently used in practice, an optical image of an alignment mark on a wafer is imaged upon an image pickup device such as a CCD camera, and an electrical signal obtainable thereby is image-processed, whereby the position of the wafer is detected.

Currently, there are exposure apparatuses of a type called a stepper, and exposure apparatuses of a type called a scanner. The following description will be made of a stepper type exposure apparatus, as a representative example.

The non-exposure light TTL off-axis method based on image processing can be used in an i-line stepper, but it cannot be used in an excimer stepper using an excimer laser as a light source. This is because a projection optical system when used with light having a wavlength of 633 nm which is an emission wavelength of a He—Ne laser, for example, produces a very large chromatic aberration, and the correction thereof through an alignment optical system cannot be done with a high NA (numerical aperture).

For this reason, most excimer steppers use a detection system of the non-exposure light off-axis type based on an image processing method wherein, as compared with the conventional non-exposure light off-axis system, a separate off-axis microscope is provided so that observation can be made with non-exposure light, without intervention of a projection optical system.

The non-exposure light off-axis system is a non-TTL off-axis system, rather than a TTL (Through The Lens) system, wherein a projection optical system is not passed through. Thus, any change in the distance between the off-axis microscope and the projection lens, that is, baseline, is a factor of precision deterioration.

In order to suppress the change in baseline to attain high-precision alignment, it is necessary to use in the non-exposure light off-axis system those components which are less thermally influenced or to perform baseline correction frequently.

The non-exposure light TTL off-axis system in an excimer stepper may use a method other than the image processing method. An example other than the image processing method is a dark-field detection method wherein illumination light is not detected and only limited diffraction light is used. A method called "heterodyne detection" may apply.

In the non-exposure light TTL off-axis method wherein limited diffraction light is detected, since the baseline is short, inconveniences involved in the non-TTL non-exposure light off-axis system may be avoided. However, because of the dark-field detection, a problem may arise in the detection rate as compared with a bright-field detection.

In current device production, an appropriate one of the image processing methods and other detection methods described above is selected and used, in consideration of their advantages and disadvantages peculiar to them, to meet the required alignment precision.

However, in order to meet a recent requirement for further improvement in alignment precision, there still remain some problems in relation to a semiconductor process error, which cannot be solved by any of the above-described methods.

A large problem is that there is no measure to compensate for a phenomenon that the shape of an alignment mark becomes asymmetrical due to a process or processes.

An example is a flattening process such as in a metal CMP process or the like. In the CMP process, the structure of an alignment mark may become asymmetrical, which may cause in a global alignment procedure a rotational error (FIG. 1A) or a magnification error (FIG. 1B). This results in a serious problem of decreased precision.

The distortion in the structure of a wafer alignment due to the flattening process may produce a larger error in the dark-field detection system, causing a precision decrease. Therefore, although the stability of the baseline can be accomplished by non-exposure light TTL off-axis system different from one based on the image processing method, because of its higher process sensitivity, it is used in only a few cases in practice.

In order to meet the requirement of miniaturization of ICs, it is important to improve the total overlay precision, including the alignment precision. Recently, particular note has been applied to distortion of a projection optical system when a reticle pattern is transferred to a wafer.

What is to be considered in this respect is variation of distortion due to coma aberration, depending on an illumination mode used or a pattern shape used. Conventionally, the distortion has been defined in relation to the location upon an image plane where a chief ray of light is incident, such that it has been treated as being aberration independent from the NA. However, the asymmetry of an image in practice differs with the NA, due to the influence of non-uniformness of an illumination system or coma of a projection optical system. Since the chief ray does not shift even if the NA is changed, the distortion would not change in accordance with the conventional definition. Nevertheless, an image shifts in practice. This phenomenon, if it occurs, will cause deterioration of the total overlay precision.

The distortion to be treated in the present invention is distortion in a practical sense, also taking into account the asymmetry being variable with the NA, and thus, the definition differs from the conventional one wherein distortion depends on the location on an image plane where a chief ray of light is incident. In this specification, the term "distortion" to be referred to below means the formed distortion wherein the asymmetry variable with the NA is also taken into account. If the word "distortion" in the conventional sense will be used somewhere below, it will be referred to as "distortion in the conventional sense".

The distortion wherein the symmetry variable with the NA is also taken into account, may be influenced not only by non-uniformness of an illumination system and coma aberration of a projection optical system, but also by the shape of a pattern formed on a wafer. This is because of the reason that, since the intensity distribution of diffraction light varies with the pattern shape, the influence of coma aberration of non-uniformness of the illumination system to the diffraction light also varies with it.

Currently, registration or overlay precision system are used to measure the distortion. Most of such systems use a measurement principle based on image processing. A pattern to be measured has a large size of about 10–20 microns square. An optical image of such a measurement pattern is formed on a photoelectric converting device such as a CCD camera, and the position of the pattern is detected through various image processing procedures, whereby the distortion is detected.

The distortion to be measured is the distortion wherein the asymmetry variable with the NA is also taken into account, as described above. On the other hand, a pattern with respect to which an overlay precision is required in practice in semiconductor manufacture is a pattern of the submicron order. Therefore, if the influence of the pattern shape is taken into account, determining the distortion with respect to a pattern of about 10 microns square currently used in overlay inspection systems is not effective to determine a value which is required in practice.

Some proposals have been made in an attempt to detect practical distortion.

An example is that three lines (lines-and-spaces) of 0.5 micron are provided outside a pattern of 10 microns square. Although a single line of 0.5 micron cannot be detected separately by use of an optical overlay inspection system, if three lines are combined, a positional error can be detected. Another proposal is that, while changing the exposure amount, measurement is made on the basis of a distinction, between resolved or not resolved, of a single line of 0.5 micron.

Since, however, the distortion wherein the asymmetry variable with the NA is also taken into account depends on the pattern shape, only the measurement of three lines (lines-and-spaces) of 0.5 micron does not represent a value of distortion. Particularly, there may occur a large difference with the characteristic or the like of distortion of 0.35 micron square such as a contact hole, such that the above-described method is not sufficient.

There is another problem that a fine pattern of a linewidth of 0.35 micron or less cannot be resolved on the basis of optical measurement methods currently available.

SUMMARY OF THE INVENTION

It is accordingly an object of the present invention to provide an alignment method and/or an exposure apparatus by which higher-precision alignment can be accomplished.

It is another object of the present invention to provide an offset measurement system suitably usable in such an alignment method and/or an exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1A is a schematic view for explaining a rotational error, which is one of the alignment errors.

FIG. 1B is a schematic view for explaining a magnification error, which is one of the alignment errors.

DESCRIPTION OF THE PREFERRED EMBODIMENTS

Figure 2A:
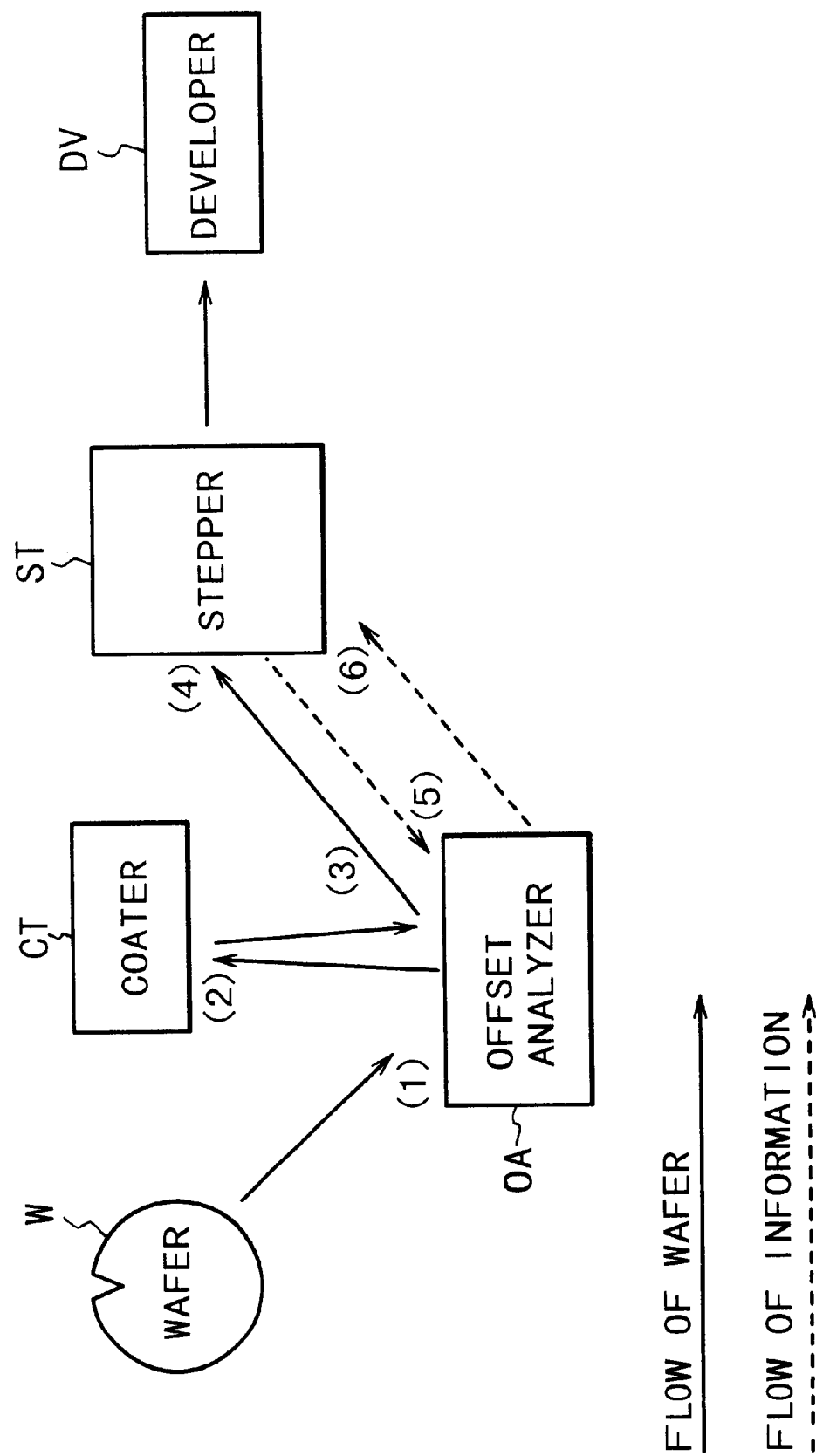
FIG. 2A is a schematic view for explaining the flow of a wafer and information in a case wherein an offset analyzer according to a first embodiment of the present invention is used.

The alignment method and alignment system in an embodiment to be described below are arranged to avoid the inconveniences caused when the TTL off-axis method and the non-TTL off-axis method are used singly. For relative alignment between a wafer and a reticle, the position of the wafer is detected by use of an alignment system of the non-exposure light TTL off-axis type having a high baseline stability. Prior to the detection by the TTL off-axis system, the shapes of plural marks each being the same as one upon the wafer to be used in the alignment are measured beforehand by use of an apparatus other than the exposure apparatus in which the alignment system is incorporated, and then an offset between the marks is detected beforehand.

In the pre-measurement, the surface shape before and after resist material application may be measured through an AFM, for example, and a three-dimensional relative positional relation between the resist and the alignment mark of the wafer is calculated, as an offset, so as to be coordinated with a signal of a detection system of the alignment system. By executing the alignment operation at the exposure apparatus side while using the thus calculated offset value, undesirable deterioration of precision due to the asymmetry in shape of the alignment mark resulting from the process, as described hereinbefore, can be avoided.

In an exposure apparatus using an alignment method and an alignment system, in an embodiment of the present invention to be described below, for an improvement of total overlay precision, there is an alignment detection system for performing relative alignment between a reticle and a wafer. When an alignment mark on a wafer is to be detected through this detection system, prior to the detection, the shapes of patterns or marks on the wafer are measured and determined beforehand by use of a measuring system such as AFM, for example, not using light, inside or outside the exposure apparatus, and then the relative positional relation between the patterns or marks is used as an offset value.

Here, the patterns or marks may be patterns of different shapes, alignment marks, or marks for use with an overlay inspecting system, for example, with which a highest overlay precision is required in the semiconductor manufacture. By using an offset value obtainable through the measurement made beforehand, overlay and exposure of a reticle and a wafer may be performed. Also, when inspection is made in an overlay inspecting system after development of the wafer, the result of the overlay wherein the offset value is reflected can be checked. Thus, a higher total overlay precision can be accomplished.

As regards the measurement of a shape based on a contact profiler or AFM, for example, when a sample is to be contacted, particularly, for the measurement of the surface shape of a resist, during a measurement mode in which a large force is applied to a sample and the sample surface is traced while a constant force is applied thereto continuously, there may be cases wherein the sample surface is scratched or scraped to cause a change in shape thereof. On that occasion, correct shape data cannot be produced. Moreover, it applies an adverse influence to a measurement value to be produced later by an alignment detection system.

In a shape measuring device to be described later, on the other hand, a probe for tracing the sample surface moves upwardly and downwardly, intermittently at a high speed, and, additionally, the force to be applied to the sample surface is small, as not greater than 50 nN. Therefore, it does not produce a change in the resist surface, and thus, correct measurement can be accomplished.

As regards the measurement of the surface shape without a resist, since in a measurement mode wherein the sample surface is traced while a constant force is applied thereto, any changes in frictional force between the sample surface and the probe may adversely effect the shape data. In the shape measuring device to be described later, on the other hand, a probe for tracing the sample surface moves upwardly and downwardly, intermittently at a high speed. Therefore, no frictional force is produced in a horizontal direction, such that correct shape data can be produced.

FIG. 2A is a schematic view for explaining the flow concerning positional information on a wafer, in an exposure apparatus in which an alignment system according to a first embodiment of the present invention is incorporated.

In the description below, the exposure apparatus will be referred to as a stepper. Similarly, an alignment detection system of an alignment system incorporated into the exposure apparatus will be referred to as an alignment scope. A system for performing wafer measurement beforehand, outside the alignment system, will be referred to as an offset analyzer. This offset analyzer functions to measure the surface shape before and after resist coating, and to calculate an offset on the basis of a three-dimensional relative positional relation between a wafer mark and a resist as measured, such that it can be coordinated with a signal of the alignment detection system in the alignment system.

Detection through an offset analyzer may use an optical method. Alternatively, it may use a high-resolution method such as a scan type tunnel microscope (Japanese Patent No. 2375632) or an atomic force microscope (AFM) (Japanese Laid-Open Patent Application, Laid-Open No. 217861/1993). Although the AFM detection may be incorporated into an exposure apparatus, in this embodiment, an example wherein AFM having a high resolution is used in an analyzer, will be explained as being representative.

The flow of a wafer and information will be explained, with reference to FIG. 2A.

Generally, symbols (1)–(6) in FIG. 2A denote the following procedure:

(1) Measure the shape of a mark without a resist;
(2) Resist Coating;
(3) Measure the surface shape of the resist;
(4) Get an alignment signal;
(5) Calculate the relative position of the mark and the resist from the alignment signal, and calculate an offset therefrom; and
(6) Execute an exposure on the basis of the offset.

More specifically, in FIG. 2A, as regards a wafer W, before coating it with a resist material, it is conveyed to an offset analyzer OA, such as depicted at (1). Then, the shape of alignment mark on the wafer, before the resist coating, is measured by using an AFM.

Subsequently, at (2), the wafer is conveyed to a coater CT whereby it is coated with a resist. Then, at (3), it is conveyed again into the offset analyzer OA, whereby the shape of the resist on the alignment mark is measured again by using the AFM.

Thereafter, the wafer is conveyed to a stepper ST at (4), and a signal of the alignment mark is detected through an alignment scope. Then, at (5), information on the signal related to the alignment mark is fed to the offset analyzer OA, from the stepper ST.

At a subsequent step (6), on the basis of the three-dimensional relative positional relation between the resist and a wafer mark, detected before and after the resist coating by use of the offset analyzer beforehand, the relation between the alignment mark signal obtained through the alignment scope and the position of the wafer mark is detected. Then, on the basis of it, an offset value for the alignment measurement is calculated, and the result is supplied to the stepper ST. In response, the stepper ST performs an alignment operation on the basis of the supplied offset, and then executes an exposure operation. After exposures of all shots on the wafer are completed, the wafer is conveyed to a developer DV for a development process. After the development process, appropriate treatments are made, whereby a circuit is formed. Since these processes for finally obtaining a semiconductor device are well known in the art, a description of them will be omitted here.

Figure 2B:
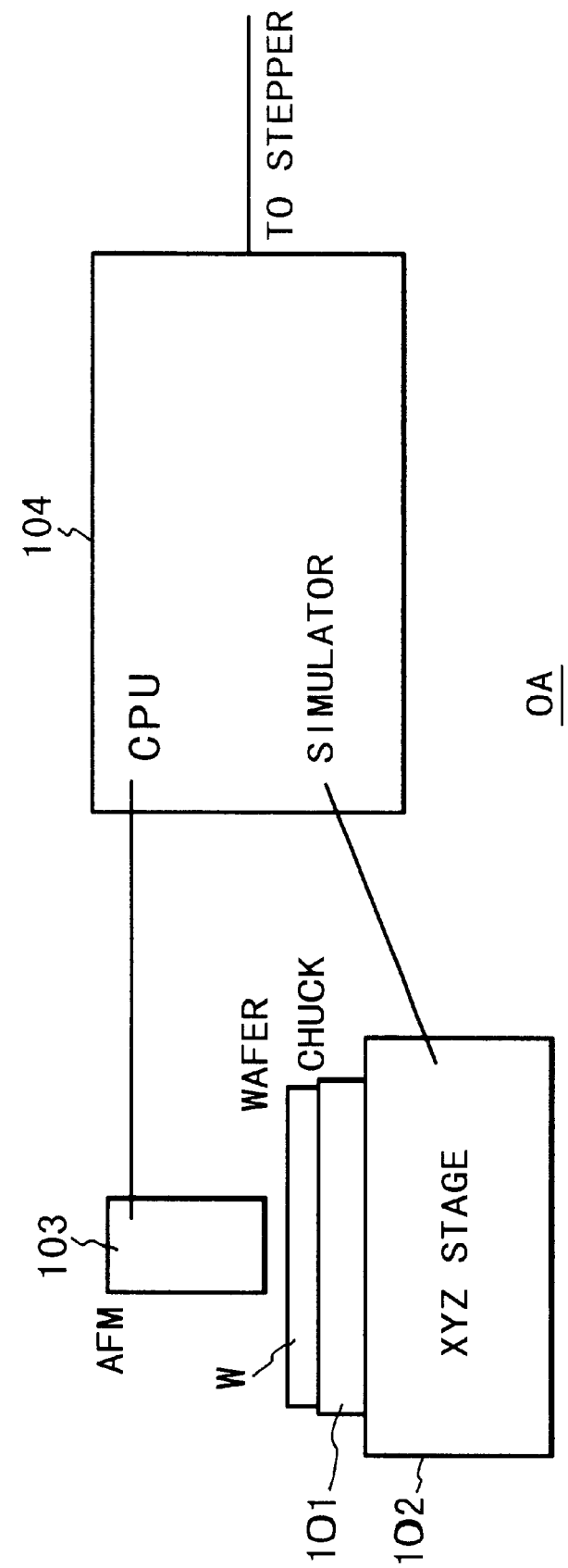
FIG. 2B is a schematic view for explaining the structure of an offset analyzer according to the present invention.

FIG. 2B shows an example of the structure of an offset analyzer.

The offset analyzer OA comprises a chuck 101 for supporting a wafer W, an X-Y-Z stage 102 for moving the chuck 101 in three-dimensional directions, an AFM (atomic force microscope) 103 for measuring the surface of a wafer with or without a resist thereon, and a CPU (central processing unit) 104 for controlling the offset analyzer as a whole and having a simulator for calculating an alignment offset on the basis of the surface shape detected. In the drawing, a wafer conveying system and a wafer three-dimensional position detecting system are not illustrated.

Figure 2C:
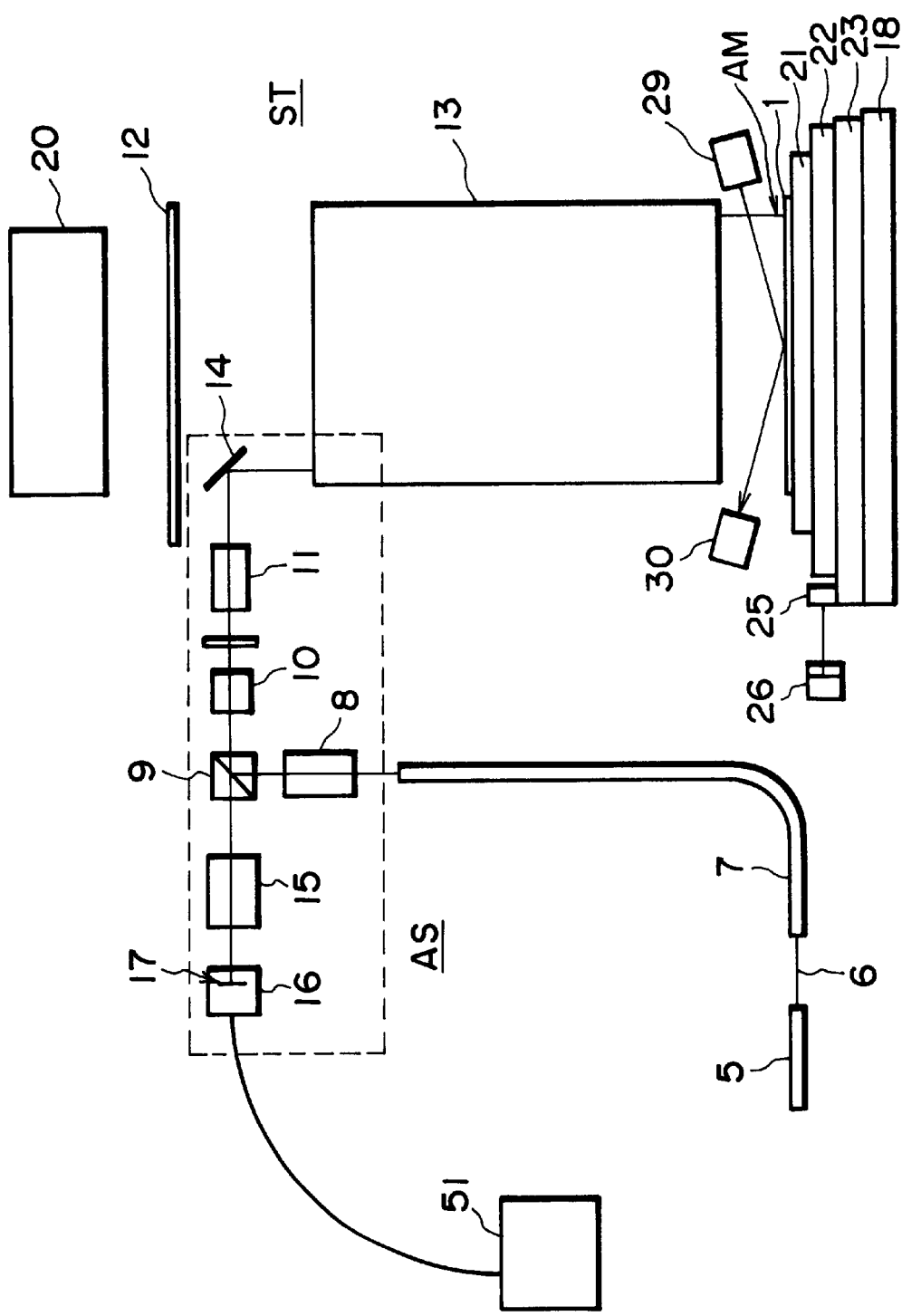
FIG. 2C is a schematic view of an exposure apparatus wherein an alignment detecting system is incorporated.

FIG. 2C shows an example of the structure of an exposure apparatus (stepper ST), which is based on the TTL off-axis method.

An alignment scope AS shown in the drawing is a detection system for detecting an alignment mark AM on a wafer 1 by use of non-sensitizing light (non-exposure light) and through a projection optical system, but not through a reticle. Here, the exposure light means such light with which a photoresist applied to wafer can be sensitized, and it may be i-line (365 nm) from a light source of an ultra-high pressure Hg lamp (in a case of an i-line stepper) or it may be the emission wavelength (248 nm or 193 nm) or an excimer laser (in a case of an excimer stepper).

Denoted at 20 is an illumination system for illuminating, with exposure light, a reticle 12 having a circuit pattern formed thereon. A projection optical system 13 functions to project the circuit pattern of the reticle 12 surface onto the surface of a wafer 1, in a reduced scale of 1:5, for example.

With the structure of the alignment scope AS, light 6 emitted from a He—Ne laser 5 passes through a fiber 7 and an illumination system 8 and, after this, it is reflected by a beam splitter 9. Then, the light goes through a relay lens 10, an objective 11, the projection optical system 13, and it illuminates an alignment mark AM on the wafer 1.

Reflection light from the alignment mark AM goes through the projection optical system 13, the objective 11 and the relay 10, in reversed order, and then it passes through the beam splitter 9. Thereafter, by means of an erector 15, an image of the alignment mark AM is formed on an image pickup surface of a CCD camera 16.

The image of the alignment mark AM is photoelectrically converted by the CCD camera 16 into an electrical signal which is then transmitted to a computer (computing means) 15 through a signal line. The computer 51 operates to process a received signal (by fast Fourier transform), and it detects the position of the alignment mark AM on the basis of the phase as produced by the signal processing.

The wafer 1 is placed on a wafer chuck 21 which is mounted on a θ-Z stage (driving means) 22. The wafer chuck 21 serves to attract the wafer 1 so as to prevent shift of the wafer 1 position against various vibrations. The θ-Z stage 22 is mounted on a tilt stage 23, and it serves to move the wafer 1 upwardly and downwardly along a focus direction (optical axis direction of the projection optical system 13).

The tilt stage 23 is mounted on an X-Y stage 18 which is controlled through a laser interferometer 26. The tilt stage function to correct any warp of the wafer 1 to minimize it with respect to an image plane of the projection optical system 13. Also, the tilt stage 23 itself is movable in the focus direction. The position of the wafer with respect to the X and Y directions can be monitored by means of a bar mirror 25 mounted on the tilt stage 23 and the laser interferometer 26, and it is reflected to the driving amount of the X-Y stage 18. The laser interferometer 26 transmits a measured value, related to the driving amount of the X-Y stage 18, to the computer 51 through a signal line.

When an exposure operation is to be made, not only the focus but also any tilt of the surface of a shot with respect to the image plane of the projection optical system 13 is detected. On the basis of the result of the detection, the tilt stage 23 corrects the overall focus state, including the tilt. A focus measuring system (29 and 30) measures the focus of the wafer 1 surface, and a measured value is transmitted to the computer 51 through a signal line.

This embodiment has a feature that, when used in a process other than first mask process, after completion of alignment measurement, a correction value (offset) provided by an offset analyzer may be used to calculate reduction magnification, orthogonality and wafer magnification, for example, representing the shot layout grid of a wafer (the subject of measurement). The values calculated may be stored into a storing device, not shown, of the exposure apparatus, such that, when an electronic circuit pattern of a reticle 12 is to be transferred to a wafer, alignment data can be corrected on the basis of the values having been calculated. Through the correction, a wafer stage 21 or a reticle stage is driven to perform successive exposures.

The offset analyzer of this embodiment is made separate from the exposure apparatus (stepper). Since the offset analyzer can be operated independently, it is possible to control the wafer procedure in accordance with a sequence not interfering with the stepper exposure. A plurality of offset analyzers may be used in relation to plural steppers. On that occasion, the number of offset analyzers may not always be equal to the number of the steppers. Further, as will be described later, an offset analyzer may be incorporated into a stepper, rather than a separate structure. Similar advantageous results are attainable on that occasion, except for throughput.

Figure 3:
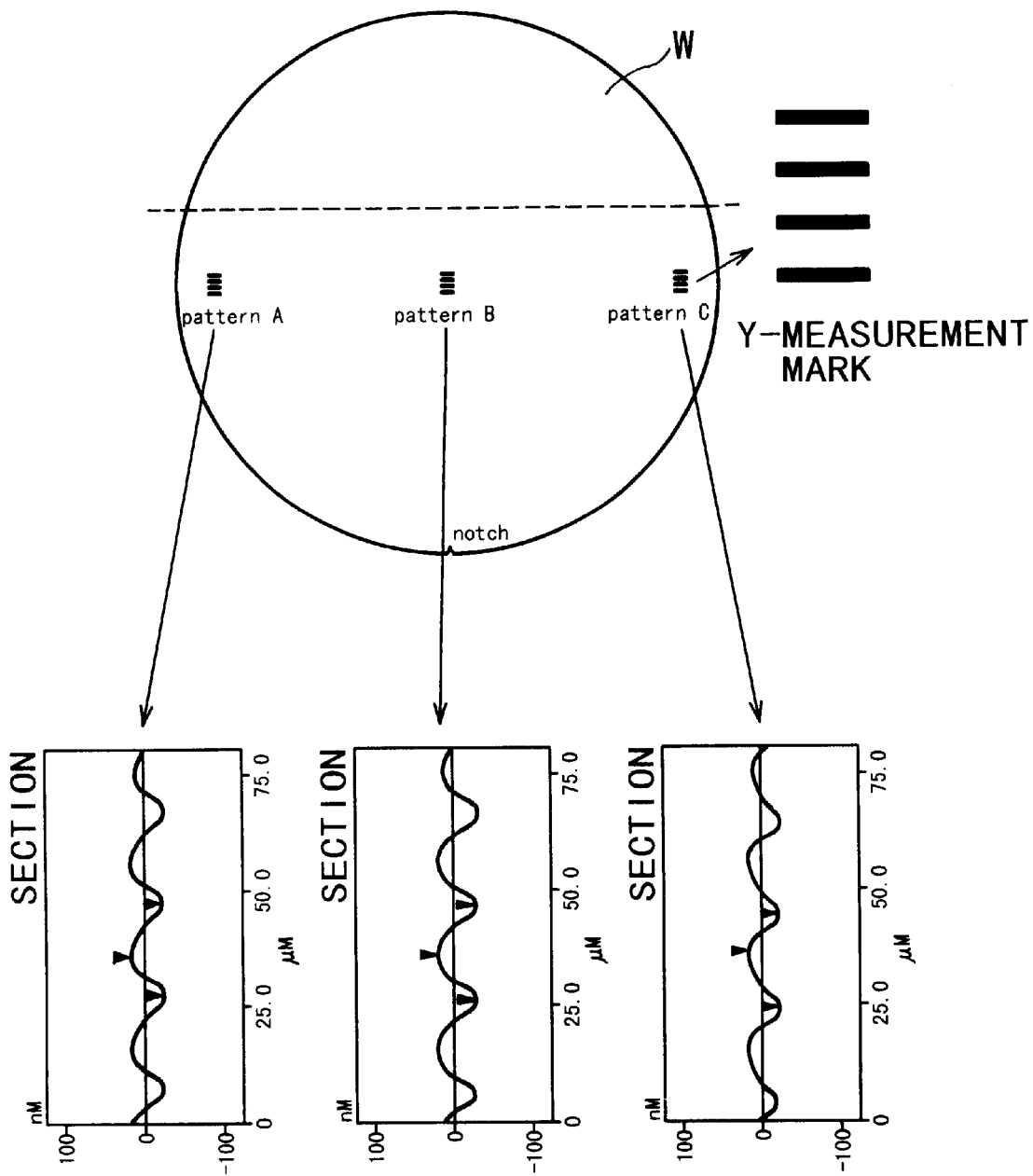
FIG. 3 is a schematic view for explaining data as produced by AFM measurement made to alignment marks.
Figure 4:
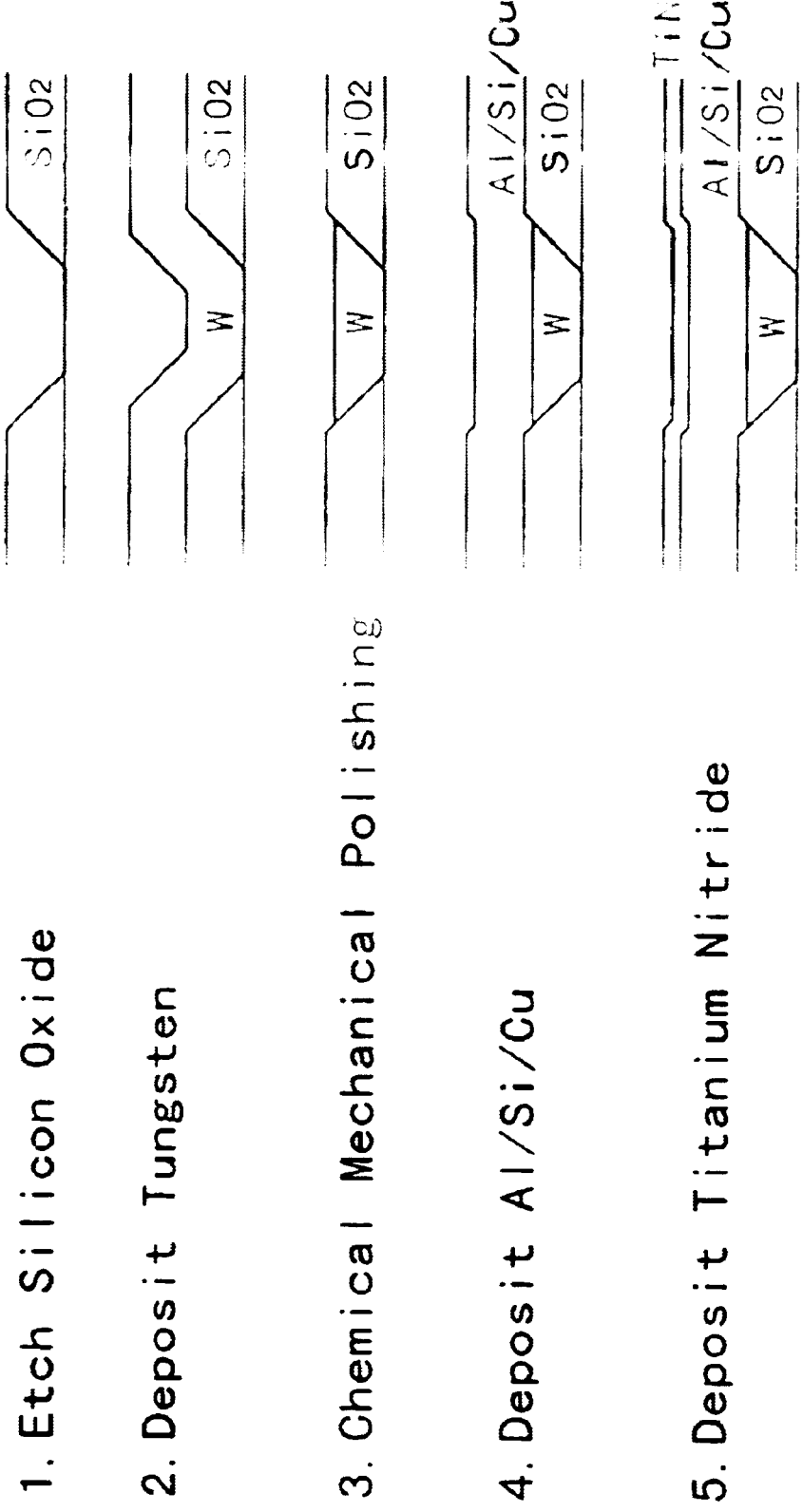
FIG. 4 is a schematic view for explaining the structure of an alignment mark, in a metal CMP process.

FIG. 3 shows data obtained by measuring practical alignment marks through an AFM. The signals shown in the drawing were obtained from a mark with a resist. The structure of the alignment mark is one produced through a process, such as shown in FIG. 4, called metal CMP.

From the data results of AFM measurement made to alignment marks at left-hand and right-hand shots and a central shot on the wafer shown in FIG. 3, it is seen that the surface shape of the alignment mark at the central shot is symmetrical, whereas the surface shape is asymmetrical at each of the left-hand and right-hand shots and also that the symmetry is inverse between the left-hand and right-hand shots.

Next, a simulator in the offset analyzer, for calculating an offset on the basis of the shape of an alignment mark with and without a resist, will be explained.

Examples of commercially available simulators are EMFLEX, Avant! and Metropole (trade names) of Weidlinger Associates Co., U.S.A.

Such a simulator can solve, with vectors, Maxwell equations related to the propagation of light in accordance with the finite element method, to determine how and what signal is obtainable with light from an alignment mark, in a practical structure. Also, it can simulate a detection signal for an alignment mark to be produced through an alignment scope in a practical structure, including aberrations of an optical system, for example.

On the basis of a signal obtained by solving the Maxwell equations, various signal processings such as FFT (fast Fourier transform), described above, for example, are performed. Then, from the phase thus obtained, the position of the alignment mark AM is detected. The signal processing procedure described above should be made with the same algorithm as that to be used in the stepper in practice. Any difference between the thus detected position and the actual position of the alignment mark is the offset.

The processing to be done in the offset analyzer is not limited to the FFT (fast Fourier transform). Any other image processing methods may be used.

Figure 8:
FIG. 8 is a schematic view, showing a sectional structure of an asymmetrical alignment mark.

For accomplishing high precision alignment, it is necessary to define the portion of an alignment mark with respect to which the alignment offset is to be produced. Specifically, if the alignment mark AM has an asymmetrical structure as shown in FIG. 8, it is necessary to determine the portion of the alignment mark (i.e., the top T, the bottom B or the middle or average) with respect to which the alignment procedure is to be made, and then to operate the offset analyzer to perform a corresponding procedure.

Figure 5:
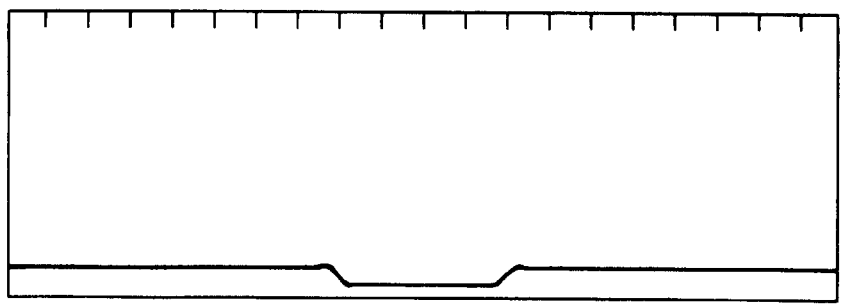
FIG. 5 is a graph of data as produced by AFM measurement made to an alignment mark without a resist.
Figure 6:
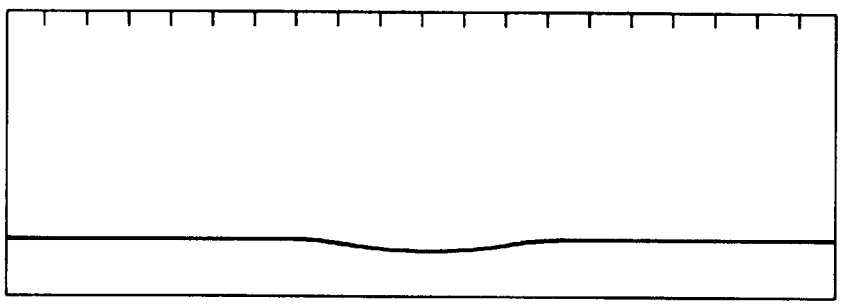
FIG. 6 is a graph of data as produced by AFM measurement made to an alignment mark with a resist.
Figure 7:
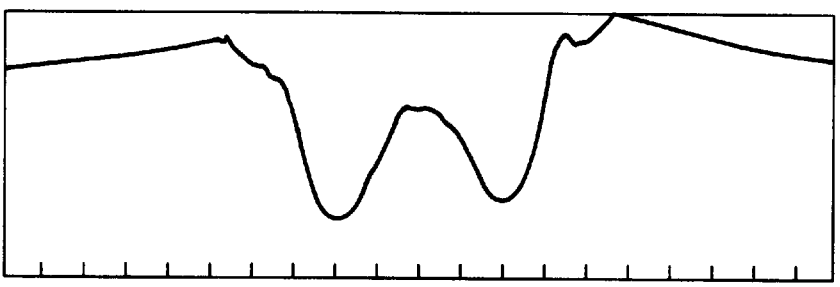
FIG. 7 is a graph of data as produced by simulation made to information on cases with and without a resist.

Offset information can be produced in accordance with the top T, the bottom B and an average value, respectively. FIGS. 5, 6 and 7 show practical calculation methods.

FIG. 5 shows data as produced by AFM measurement made to the top of an alignment mark without a resist. FIG. 6 shows data as produced by AFM measurement made upon an alignment mark with a resist. FIG. 7 shows a signal as produced by calculation, through simulation, of an alignment signal on the basis of information with and without a resist (FIGS. 6 and 7). The signal simulation was done in connection with a bright-field image.

As described hereinbefore, by calculating beforehand, an offset to be produced in the measurement of an alignment mark with a TTL off-axis system using non-exposure light, by use of an offset analyzer, deterioration of precision due to asymmetry in the shape of the alignment mark, resulting from a process or processes, can be prevented. Further, the offset analyzer may be provided independently of a stepper and, on that occasion, a high precision and high throughput alignment system can be accomplished.

The measurement through the offset analyzer may be made to all wafers. Alternatively, it may be made in a sequence for a first wafer, under limited conditions, and an offset obtained with respect to the first wafer may be used for the remaining wafers.

The offset obtained in relation to the first wafer can be used for the remaining wafers, provided that dispersion in asymmetry of the shapes of alignment marks of the wafers is small. For example, it is applicable to wafers in the same lot.

For example, a detection signal or signals for an alignment mark or marks of a single wafer or plural wafers may be produced at the stepper side, beforehand. The detection signal or signals may be memorized. A detection signal for an actual wafer may be matching-processed and, if, under the best matched state, a measured value obtainable from the detection signal is less than a predetermined threshold value, the memorized offset may be used for that wafer. If the measured values is larger than the threshold value, the offset value measurement may be made again for that wafer.

Namely, it is not always necessary for the offset analyzer to perform measurement and calculation with respect to every wafer.

As described hereinbefore, use of a TTL off-axis system with non-exposure light effectively avoids the problem of precision deterioration due to a change in baseline (distance between the off-axis microscope and the projection optical system) as in a case in which a non-TTL off-axis microscope is used. Also, deterioration of precision due to asymmetry in shape of an alignment mark, resulting from a process or processes, can be avoided. Therefore, a high precision and high throughput alignment operation can be accomplished.

The first embodiment of the present invention described above includes a wafer detection system which uses an AFM, only, as an offset analyzer. A second embodiment of the present invention may use an offset analyzer in which an alignment detection system the same as an alignment scope of a stepper is provided together with an AFM. More specifically, an alignment scope similar to one shown in FIG. 2C may be incorporated into the structure shown in FIG. 2B, as an offset analyzer, by which an alignment signal can be produced. Since the same detection system as that of a stepper is used, the procedure at (5) and (6) in FIG. 2A for calculating an offset after conveying a wafer and aligning the same, can be omitted.

In this embodiment, it is necessary that the information related to an error of the alignment scope of the stepper is detected beforehand. Such error information may include coma aberration of an optical system or uniformness of an illumination system, for example.

The alignment scope of the stepper may be adjusted to reduce the error to a level that can be disregarded. Alternatively, the alignment scope of the stepper and the analyzer of the offset analyzer may be adjusted to produce errors of the same level.

As an alternative embodiment, once the error information related to the alignment scope system of the stepper is detected beforehand, the offset analyzer may not be provided with an alignment detection system similar to the alignment scope of the stepper, but, rather, all the errors may be converted by the simulator to calculate an offset.

The shape measurement to an alignment mark forming region of a wafer may be made, only either before or after the resist material coating, in the following cases.

(1) If the component of a position detection error attributable to non-uniform coating of a resist is very small so that it can be disregarded, only the shape of the alignment mark forming region before resist application may be measured. The shape after the resist application can be predicted from the shape before the resist application. Thus, from the shape actually measured before the resist application and from the predicted shape after the resist application (it may be simulated by a simulator or a shape prediction table may be prepared on the basis of experiments), the offset value measurement may be done in a similar manner as described above.

(2) If the error in shape of an alignment mark before application of a resist material is very small so that it can be disregarded, this shape may be detected beforehand or it may be measured only in relation to a first wafer. Only the shape of the alignment mark forming region after the resist application may be measured. Thus, from the predetected shape before resist application and the shape actually measured after the resist application, offset value measurement may be done in a similar manner as described above.

The detection method using an offset analyzer, in the present invention, is not limited to use of a TTL off-axis system. It can be applied similarly to an off-axis microscope, and precision deterioration due to asymmetry of the shape of an alignment mark caused by a process, can be prevented.

Since an off-axis microscope is based on the non-TTL off-axis method, against baseline variation, it is preferably to use components which are less thermally influenced or to perform baseline correction frequently.

Recently, not only the alignment precision but also the total overlay precision, which represents the alignment precision with respect to the whole shot, becomes very important. While the alignment precision concerns a positional deviation with respect to a single point in one shot, the total overlay precision relates to the whole area of the shot. Thus, distortion of a projection optical system should be considered.

Here, a method of measuring distortion of a projection optical system, for transferring a reticle pattern to a wafer, will be explained first. As a reference for the distortion measurement, generally, an X-Y stage having a laser interferometer is used.

In the distortion measurement, first, any positional error of a mark on a reticle, for transferring a pattern of a projection optical system to a wafer, is measured while moving the reticle through an X-Y stage having a laser interferometer. The reticle is provided with a pattern having a size of about 10 microns square (X-Y measurement can be done thereto), which is formed inside the range of a single exposure by the projection optical system, for example, at 81 (=9×9) points within 22 mm square. The numerical values referred to here are those values taken on the wafer. The size upon the reticle is 5× the value if the reduction ratio of the projection optical system is 1:5, and is 4× if the reduction ration is 1:4.

Subsequently, while using the reticle with respect to which the mark positional error has been measured as described above, a pattern is transferred onto a wafer through the projection optical system. The wafer has been coated with a resist. Thus, through a development process after the exposure, the resist material in a portion having been exposed is removed, whereby a desired pattern is produced.

The distortion measurement may be done in accordance with any one of two methods, distinguishable with respect to the number of exposures, that is:

(1) Single Exposure Method; and (2) Double Exposure Method.

The single exposure method is that: the position of a resist pattern formed is measured by use of a length/size measuring device. Then, from the measured value thus produced, a positional error of the reticle having been measured beforehand is subtracted. A value resulting from this subtraction is taken as a distortion of the projection optical system. The driving precision of an X-Y stage with a laser interferometer, provided in the length/size measuring device determines the measurement precision in the single exposure method.

In the double exposure method, on the other hand, first, like the single exposure method, the whole range of a single exposure of the projection optical system, for example, the whole surface of 22 mm square, is exposed. As in the former method, the reticle is formed with marks of a number 81 (=9×9) of 10 microns square on the wafer. The wafer is exposed twice uninterruptedly, without a development process. In the second exposure process, only a central portion of the reticle is illuminated with exposure light, such that only a mark of 20 microns square disposed at the central portion is exposed. Here, the exposures are made sequentially while moving the X-Y stage having a laser interferometer inside the exposure apparatus, so as to assure that the mark of 20 microns square to be printed on the wafer is superposed on the mark of 10 microns square at 81 points (=9×9) having already been printed inside a 22 mm square. Thus, the second exposure is performed a total of 81 times.

A wafer having its second exposure completed is developed and, after, an overlay inspecting device is used to measure the degree of overlay or superposition of the marks of 10 microns square and 20 microns square, by which distortion of the projection optical system can be calculated. What determines the precision of distortion measurement is the precision of the X-Y stage with a laser interferometer, provided in the exposure apparatus.

Figure 9:
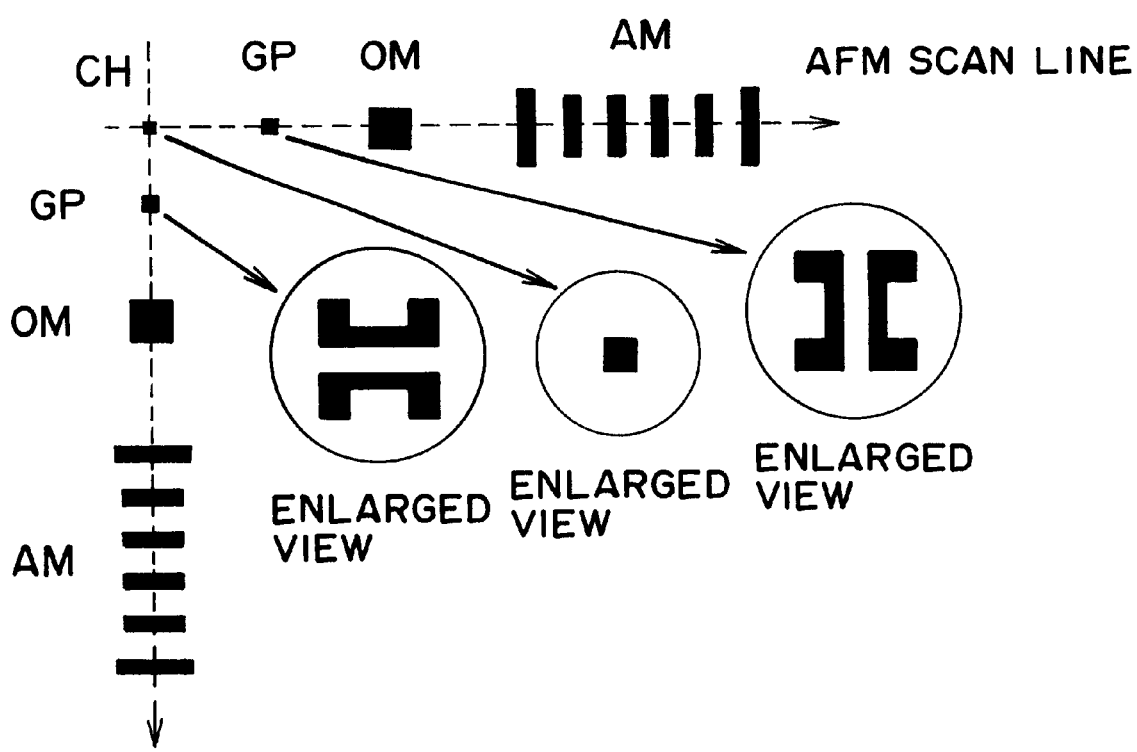
FIG. 9 is a schematic view for explaining measurement of distortion in relation to patterns or marks, to be produced by a projection optical system, in an embodiment of the present invention.

FIG. 9 shows a third embodiment of the present invention, and illustrates the disposition of patterns and marks to be used for improved total overlay. In FIG. 9, patterns of such shapes with respect to which the overlay precision is most required in the semiconductor manufacture (in this example, a contact hole CH and a gate pattern GP) as well as an overlay inspection system mark OM and an alignment mark AM are disposed along X and Y directions. They are disposed in an array in order to assure that, when the relative positional relation of the patterns or marks is measured by use of a measuring system which does not use light, such as an AFM of an offset analyzer as described hereinbefore, the measurement can be done in a single scan range. A reticle having a pattern combination, based on such plural patterns and marks arrayed as described, being disposed at 81 points (=9×9) within a 22 mm square, is exposed and transferred to a wafer, coated with a resist, through the projection optical system. Then, a development process for the wafer is performed.

The thus developed wafer is conveyed to an offset analyzer, and the relative positional relation of the patterns or marks described above is measured by use of a measuring system not using light, such as the AFM of the first embodiment, for example.

The measurement is made in accordance with the exposure condition of the projection optical system, such as NA or illumination condition, for example. The result of the measurement made to the relative positional relation of corresponding patterns or marks, is reflected to the result of distortion as measured by use of the mark of 10 microns square or the marks of 10 microns square and 20 microns square. Thus, distortion corresponding to a pattern difference is automatically corrected, by use of a pattern to be used practically.

If, for example, an offset of simple deviation occurs between the gate pattern GP and the alignment mark AM, an offset for correcting this shift during the alignment process is reflected to the apparatus, and the exposure process is performed. The offset of such a simple deviation may result from that: an eccentric coma aberration of a projection optical system causes constant coma aberration over the whole picture field, such that a constant offset is produced between the gate pattern GP and the alignment mark AM.

If complicated deviation occurs between the contact hole CH and the overlay inspection system mark OM, during reticle patterning for transferring an actual semiconductor pattern, the offset between the patterns or marks to be measured in this embodiment may be reflected.

This embodiment uses a measuring system, not using light, such as the AFM (FIG. 2B) as an offset analyzer. The X-Y stage is driven so that the whole wafer surface can be measured by the AFM of the offset analyzer, and the relative positional relation between the patterns or marks is measured. The measured value is transmitted to the stepper, through the CPU.

In accordance with the procedure described above, distortion as produced by a projection optical system can be measured, appropriately, in accordance with a practical pattern shape, NA or illumination condition. Thus, by executing offset correction while using the result of the measurement, high precision total overlay can be accomplished.

The measurement sensor of the offset analyzer is not limited to the use of an AFM. A contact-type profiler, an SEM or a scan-type tunnel microscope, for example, may be used, as in the preceding embodiment.

In the embodiment described above, by measuring distortion beforehand, high precision total overlay is accomplished. When the X-Y stage of the offset analyzer is provided with a high precision function, then a measuring system capable of performing direct measurement to an actual device is accomplished. This is a fourth embodiment of the present invention. As the offset analyzer, a structure such as shown in FIG. 2B may be used. It may function to measure the surface state, before and after the resist coating, outside the alignment scope of the exposure apparatus, and then to calculate an offset in connection with a three-dimensional relative positional relation between the resist and the wafer as can be coordinated with a signal of a detection system of the alignment system.

Figure 10:
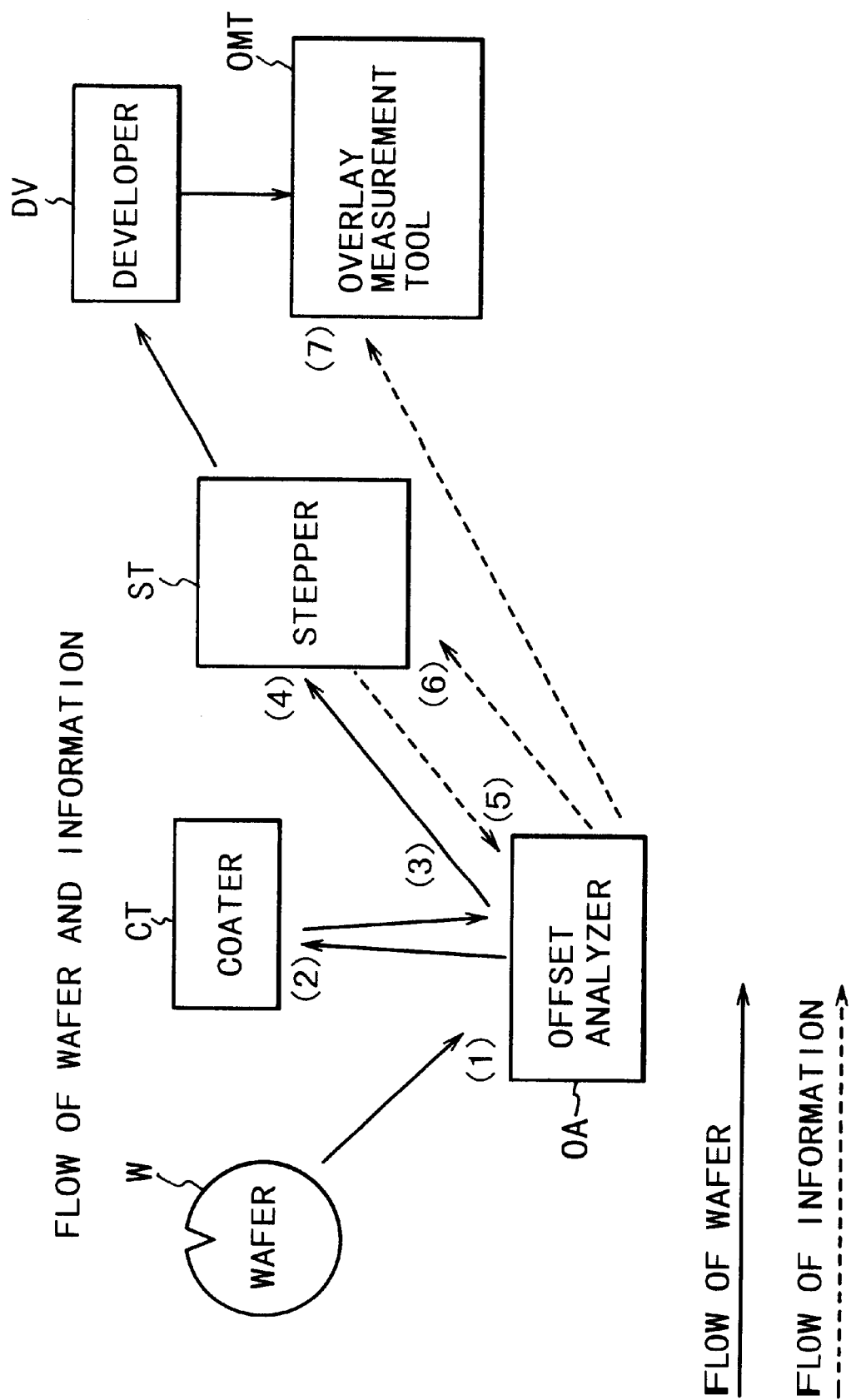
FIG. 10 is a schematic view for explaining the flow of a wafer and information in a case wherein actual device measurement is made with use of an offset analyzer according to another embodiment of the present invention.

FIG. 10 shows the flow of a wafer and information, in the direct measurement according to the fourth embodiment. The flow of FIG. 10 differs from FIG. 2A in the points of a pattern or mark to be measured and of the manner of reflection of the offset to the overlay inspecting system. In the embodiment of FIG. 2A, the subject to be measured is only the alignment mark. In this embodiment, as compared therewith, patterns of different shapes with respect to which an overlay precision is most required in the semiconductor manufacture, as well as an alignment mark and an overlay inspection system mark are measured. By comparing corresponding measured values with each other, a mutual offset of them is determined.

Generally, symbols (1)–(7) in FIG. 10 denote the following procedure:

(1) Measure the shapes of marks without a resist;
(2) Resist Coating;
(3) Measure the surface shape of the resist upon an alignment mark;
(4) Get an alignment signal;
(5) Calculate the relative position of the mark and the resist from the alignment signal, and calculate and offset therefrom;
(6) Execute an exposure while reflecting the offset at (1) and (5); and
(7) Perform the procedure while reflecting the offset at (1).

More specifically, first, at (1), before coating a wafer with a resist material, a relative positional relation between plural patterns is performed, with respect to which an overlay precision is most required in the semiconductor manufacture, and using the alignment mark or the overlay inspection system mark described above. In the preceding embodiment, a resist pattern formed by using an exclusive reticle is brought into the scan range of the AFM. In this embodiment, as compared therewith, an actual device can be measured directly.

Thus, in this embodiment, the X-Y stage of the offset analyzer is made movable through a wide range, and it should have a high precision. Before the resist coating, the positional relation concerning a gate pattern, for example, an overlay inspection system pattern or an alignment mark, is measured, this being made with reference to the X-Y stage.

Subsequent procedures are similar to those of FIG. 1. At (2), the wafer is conveyed to a coater whereby it is coated with a resist. Then, at (3), it is conveyed again into the offset analyzer, whereby the shape of the resist on the alignment mark is measured again by using the AFM.

Thereafter, the wafer is conveyed to a stepper at (4), and a signal of the alignment mark is detected through an alignment scope. Then, at (5), information on the signal related to the alignment mark is fed to the offset analyzer, from the stepper.

At a subsequent step, step (6), on the basis of the three-dimensional relative positional relation between the resist and a wafer mark, detected before and after the resist coating by use of the offset analyzer beforehand, the relation between the alignment mark signal obtained through the alignment scope and the position of the wafer mark is detected. Then, on the basis of this, an offset value for the alignment measurement is calculated, and the result is supplied to the stepper. In response, the stepper performs correction on the basis of the supplied offset, and then executes an exposure operation. After exposures of all shots on the wafer are completed, the wafer is conveyed to a developer for a development process.

In this embodiment, the sequence further goes to step (7) where an alignment component and a distortion component, obtained at (1), are separated from each other, and the total overlay is checked. Since there is an offset between the distortion of the pattern, with respect to which the overlay precision is most required, and the overlay inspection system mark as described hereinbefore, use of the offset is a requirement.

Since use of the offset analyzer effectively prevents deterioration of precision due to asymmetry in the shape of the alignment mark, resulting from a process, practical distortion measurement can be done without being influenced by a semiconductor manufacturing process such as CMP, for example. Therefore, high precision and high throughput alignment is accomplished. Also, there is no necessity of a complicated optimization operation in the process, and an improvement of COO is attainable.

While the foregoing description has been made in relation to an exposure apparatus called a stepper, the present invention is effectively applicable also to an alignment method in various exposure methods such as a scanner, a unit magnification X-ray exposure, an electron-beam direct pattern drawing, and EUV, for example.

In the embodiment described above, the exposure apparatus and the offset analyzer are made separate from each other, for improved throughput. If the throughput is tolerant, an offset analyzer may be incorporated into an exposure apparatus to perform the measurement with it.

The offset analyzer may comprise an optical-type measuring device. Examples wherein an interference microscope is used as an offset analyzer, will be described below.

Figure 11:
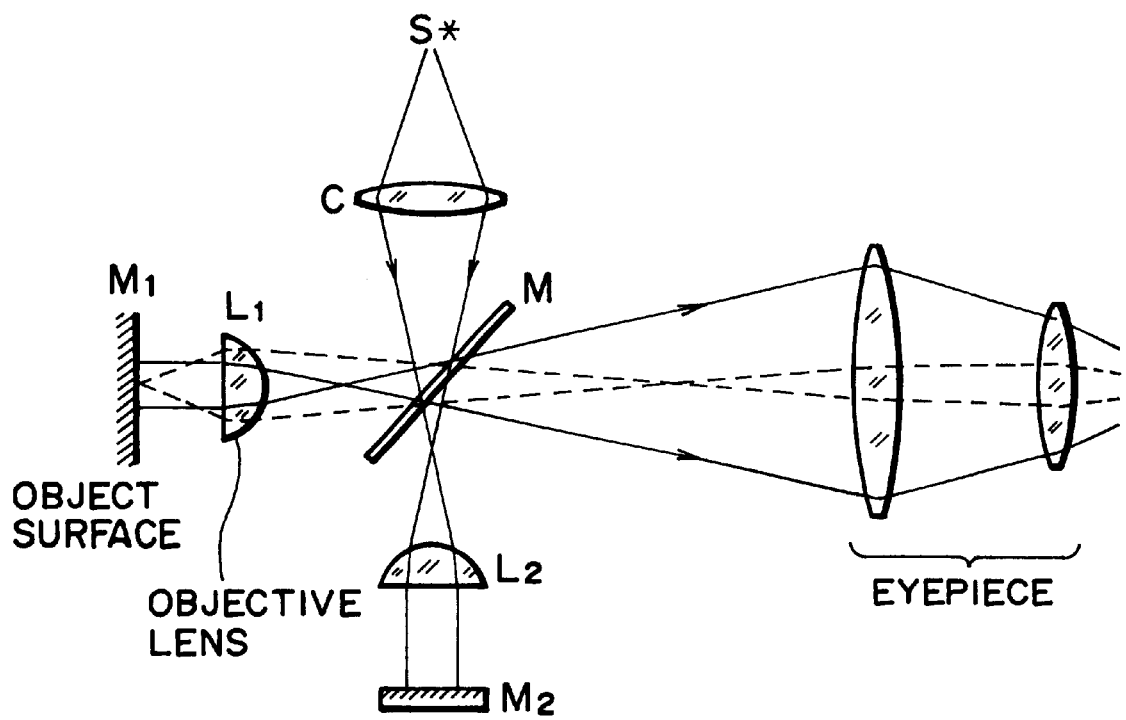
FIG. 11 is a schematic view of a Linnik interference microscope system.
Figure 12:
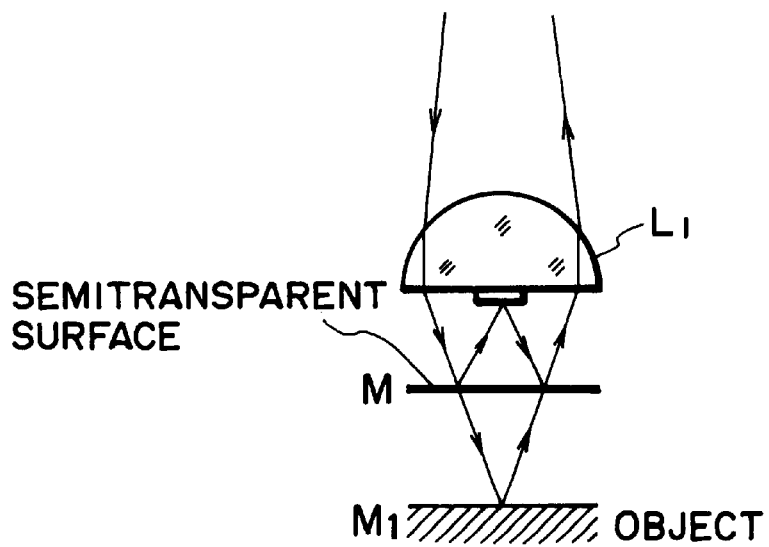
FIG. 12 is a schematic view of a Mirau interference microscope system.

FIG. 11 is a schematic and fragmentary view of an example wherein a Linnik interference microscope is used. FIG. 12 is a schematic and fragmentary view of an example wherein a Mirau interference microscope is used. For details of these optical systems, reference may be made to "Wave Optics", Hiroshi Kubota, Iwanami Shuppan, Inc., pages 414–415.

In the Linnik interference microscope system shown in FIG. 11, the same optical elements (i.e., lens $L_2$ and surface $M_2$) as the objective (i.e., objective lens $L_1$ and object $M_1$) are provided on the reference light side, to thereby cancel abaxial aberration in design. Denoted at S is a light source, and denoted at C is a condenser lens. Denoted at M is a half mirror.

In the Mirau interference microscope system shown in FIG. 12, a half mirror is disposed between an objective and an object to be observed, and the light reflected by the half mirror, and impinging on a reference reflection surface $M_3$ which is defined on the lens $L_1$, and then reflected thereby, is used as reference light.

As regards the manner of shape measurement, when a He—Ne laser is used as the light source S, images at four focuses (images obtainable while changing the focus amount successively each by $\lambda/4$) may be used to perform three-dimensional shape measurement (fringe scan method).

On the other hand, when a halogen lamp is used, white color interference occurs so that the coherence length becomes short. Thus, three-dimensional shape measurement using the same is attainable (coherence probe method).

As regards the fringe scan method, which is one of the three-dimensional shape detecting methods, reference may be made to "Needs and Seeds in Optical Measurement", Corona Inc., page 228. As regards the coherence probe method, reference may be made to "New Optical Microscopes", Volume 1, "Theory and Practice of Laser Microscope", Gakusaikikaku Co., page 82. Description of the detail of them will be omitted here.

With the structure described above, even if there is asymmetry in an alignment mark of a wafer produced due to a process, the influence of such asymmetry can be removed by measuring the shape of the mark beforehand and by calculating an offset to be produced thereby. Since the offset analyzer is provided separately from the exposure apparatus, there occurs no problem of a decrease in throughput of the exposure apparatus, in this embodiment. Thus, high precision alignment, being stable without being influenced by processes, can be accomplished.

Further, since the distortion produced by a projection optical system can be measured appropriately in accordance with the pattern shape, NA or illumination condition, high precision total overlay can be accomplished on the basis of offset correction using the result of the measurement.

In some embodiments of the present invention to be described below, the relative positional relation between the shapes of a surface step pattern before and after the application of a resist coating, for calculation of an offset value, is determined on the basis of the rotational speed and time of a coater, for the resist material coating, as well as the viscosity and the applied amount of the resist material. Alternatively, or in addition thereto, it is determined on the basis of the resist film thickness at a portion on the substrate (wafer) having a surface step pattern, in which portion there is no such surface step defined.

The relative positional relation regarding the surface step pattern shape before and after the formation of the resist film coating, for calculation of an offset value, may be determined on the basis of an imagewise signal as detected by image pickup means. This method may preferably be used in combination with the method described above.

In the examples described just above, an atomic force microscope (AFM) may preferably be used in the surface shape measuring mechanism. Alternatively, the mechanism may use a contact type profiler.

When an AFM or a contact-type profiler is used in the surface shape measuring mechanism, a probe for tracing the surface of a surface step pattern may be arranged to move upwardly and downwardly, intermittently, along a direction perpendicular to the surface of the substrate, to trace the same.

Also, when an AFM or a contact-type profiler is used in the surface shape measuring mechanism, the force applied to the surface of a surface step pattern by a probe for tracing that surface may be kept at 10 nN or less.

In the structure described above, when the shape of the resist surface adjacent to an alignment mark on a wafer surface is asymmetrical and even if there are a location of a shape nearly symmetrical and a location of a shape not at all symmetrical, mixed, an offset value due to the influence of refraction at the resist film can be calculated from the surface shape information at the surface step pattern portion, as obtained by the surface shape measuring mechanism. By subtracting this offset value from positional information about the surface step pattern, produced on the basis of an image of the surface step pattern as illuminated by the illumination mechanism and detected by the image pickup means, the influence of asymmetry of the resist film thickness distribution about the mark can be avoided. Thus, even in an alignment method wherein the central position of an alignment mark is detected on the basis of the symmetry of the waveform, there is no deterioration of detection precision or no decrease of alignment precision.

Now, a simulator for calculating the offset value from the resist surface shape, will be explained.

There are various simulators usable. An example of a commercially available simulator is EMFLEX of Weidlinger Associates Co., U.S.A. This simulator can solve, with vectors, Maxwell equations related to the propagation of light in accordance with the finite element method, to determine how and what signal is obtainable with light from an alignment mark, in a practical structure. Also, it can simulate a signal under practical conditions, including aberrations of an optical system, for example.

On the basis of the signal thus obtained, the gravity center may be calculated in accordance with a pattern matching method described above, for example, to determine the offset amount (with respect to the central position of the alignment mark) attributable to the asymmetry of the resist shape. Also, the signal processing procedure for detecting the gravity center from a signal waveform produced by the simulation, should be made with the same algorithm as that to be used in the stepper in practice. As a method of detecting the position from a signal waveform, there has been proposed a method in which a template is used and the position is detected on the basis of a pattern matching method (Japanese Patent Application Laid-Open No. 115815/1997).

Figure 14:
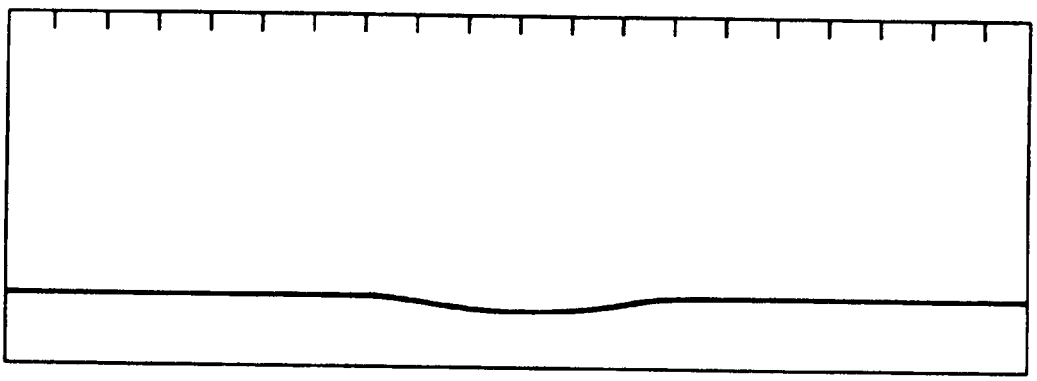
FIG. 14 is a graph of data as produced by measurement made to an alignment mark with a resist and with use of an atomic force microscope.
Figure 15:
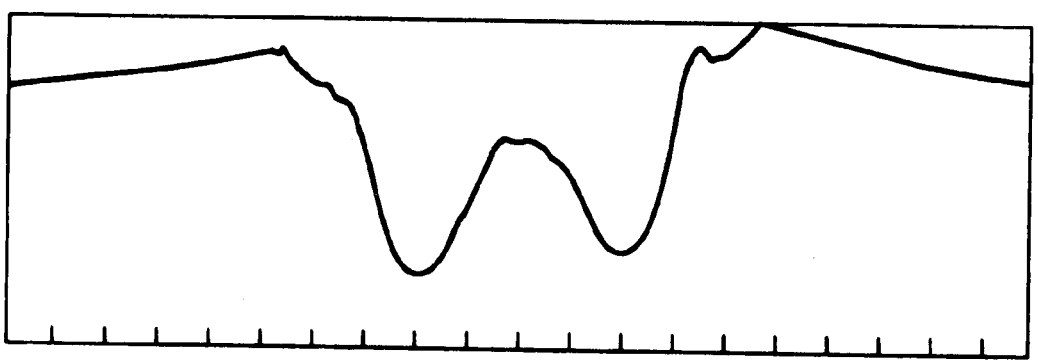
FIG. 15 is a graph of a signal as produced by simulation made to an alignment signal waveform, on the basis of the data shown in FIGS. 13 and 14.

Next, practical examples of calculations will be described with reference to FIGS. 13, 14 and 15.

Figure 13:
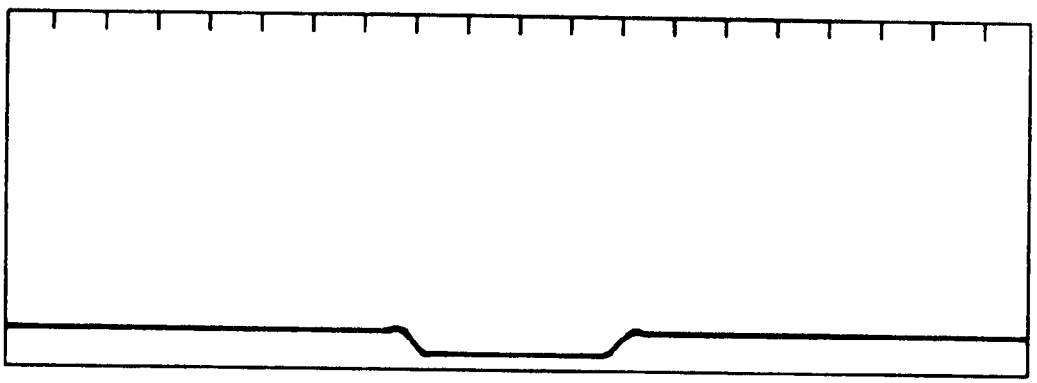
FIG. 13 is a graph of data in a case wherein a representative (typical or idealistic) alignment mask shape is given, without a resist.

FIG. 13 shows the data in a case wherein a representative (typical or idealistic) alignment mark shape is given, without a resist. FIG. 14 shows the data as produced by measurement made to an alignment mark with a resist and with the use of an atomic force microscope. FIG. 15 shows a signal as produced by simulation made to an alignment signal waveform, on the basis of the data shown in FIGS. 13 and 14.

From this waveform, the gravity center is detected in accordance with a pattern matching method, for example, and the difference in gravity center position with a case wherein the resist shape is symmetrical is calculated as an offset value. In order to calculate this signal, the relative positional relation between the data of the alignment mark shape (FIG. 13) and the surface shape of the resist film as formed on the alignment mark (FIG. 14) has to be determined.

A first example of a determination is a method in which it is determined from the rotational speed and time of a coater, for coating a wafer with a resist, the viscosity and the applied amount of the resist material. On the basis of these parameters and in accordance with the relation between the alignment mark surface step and the resist film thickness, having been detected beforehand through experiments, the film thickness at the surface step portion can be detected. Thus, the relative position between the mark shape data and the resist film thickness data can be determined.

A second example for determination is a method in which it is determined from the resist film thickness at a location, on the substrate having a surface step pattern, where no such surface step is present. For the film thickness control in the resist coating process, usually, the film thickness measurement is made to a few points upon the substrate. By using such film thickness data, the film thickness at the mark surface step portion can be detected from the relation between the film thickness at the mark surface step portion and the film thickness at a portion where there is no such surface step, as having been prepared beforehand through experiments. Thus, as in the first example, the relative position between the mark shape data and the resist film shape data can be determined.

A third example is a method in which it is determined on the basis of an imagewise signal as detected by image pickup means. Usually, wafer alignment is performed only on the basis of such an imagewise signal. By making the waveform of an alignment signal, obtainable by simulation from the mark shape data and the resist film shape data, to be coordinated with the waveform of a detection signal to be detected actually, the relative position between the mark shape data and the resist film shape data can be determined.

If performing any one of the first to third methods singly is insufficient in connection with the required alignment precision, the film thickness may be detected in accordance with the first and second methods, and then minute correction may be made by using the third method. On that occasion, the offset value to be calculated has a very high reliability, such that high precision alignment can be accomplished.

In these methods, it is necessary to measure the relation between the process condition and the film thickness beforehand or to perform measurement to obtain the relation in film thicknesses between the portions with and without a surface step beforehand. However, there is no necessity of doing shape measurement prior to coating a wafer with a coating which is to be actually exposed. Therefore, there is no possibility of contamination of or scratching the wafer not yet coated with a resist.

As regards the surface shape measuring mechanism, when an atomic force microscope is used therefor, the addition of the same to an alignment system of a conventional structure is easy. Further, the surface shape of a resist can be measured quickly and very precisely.

When an atomic force microscope or a contact-type profiler is used in the surface shape measuring mechanism, particularly, for the measurement of the surface shape of a resist, in a measurement mode in which a large force is applied to a sample and the sample surface is traced while a constant force is applied thereto continuously, there may be cases wherein the sample surface is scratched or scraped to cause a change in shape thereof. On that occasion, correct shape data cannot be produced. Moreover, it applies an adverse influence to a measurement value to be produced later by an alignment detection system.

In a shape measuring device according to the present invention, on the other hand, a probe for tracing the sample surface moves upwardly and downwardly, intermittently at a high speed, and, additionally, the force to be applied to the sample surface is small, as not greater than 10 nN. Therefore, it does not produce a change in the resist surface, and thus, correct measurement can be accomplished.

Also, in a measurement mode wherein the sample surface is traced while a constant force is applied thereto, any changes in frictional force between the sample surface and the probe may adversely affect the shape data. In the shape measuring device according to the present invention, a probe for tracing the sample surface moves upwardly and downwardly, intermittently at a high speed. Therefore, no frictional force is produced in a horizontal direction, such that correct shape data can be produced.

Figure 16:
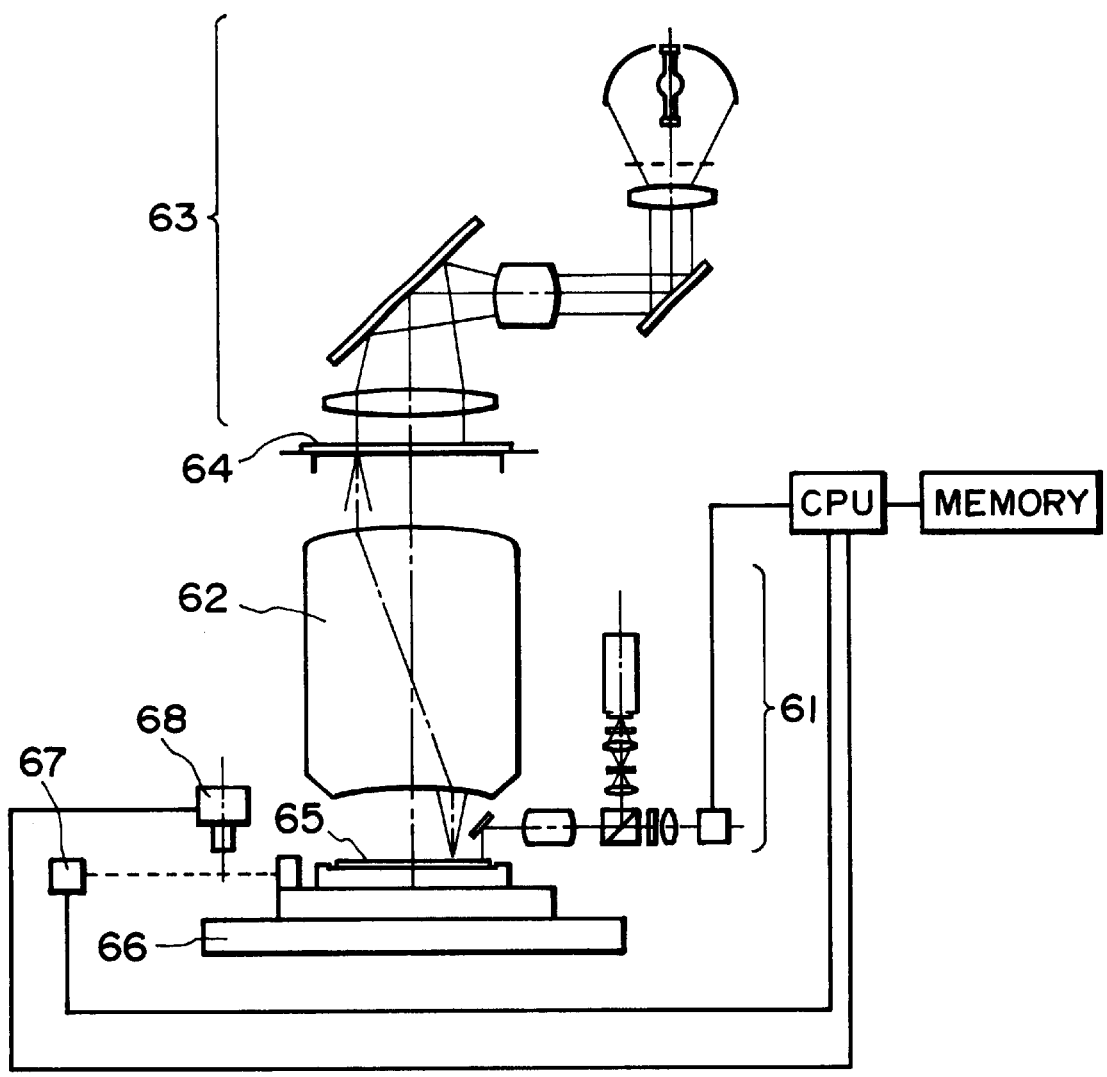
FIG. 16 is a schematic view of an exposure apparatus according to an embodiment of the present invention.

Next, a fifth embodiment of the present invention will be described with reference to FIG. 16.

A semiconductor exposure apparatus in this embodiment is based on an alignment method and an alignment system according to the present invention, and it is arranged so that: a circuit pattern formed on a reticle 64 which is placed at a predetermined position above a reduction projection lens 62 is illuminated with an exposure illumination system 63, such that the circuit pattern is projected sequentially onto pattern regions upon a wafer 65, which is placed on a movable stage 66 below the reduction projection lens 2, whereby images of the circuit pattern are transferred to these pattern regions on the wafer 65. An alignment detection system 61 comprises a mechanism for illuminating an alignment mark formed on the wafer, and an image pickup device such as a CCD, for example, taking an image of the alignment mark as illuminated. It is disposed adjacent to the reduction projection lens 2, and operates to detect the position of an alignment mark placed on a scribe line (not shown) upon the wafer 65.

The alignment mark is provided by a surface step (level difference) pattern being protruded or recessed. It is illuminated with alignment illumination light, while being covered by a resist coating.

The image of the alignment mark thus illuminated is taken by the CCD camera and, from a detection signal produced thereby, the gravity center is detected in accordance with a pattern matching method.

There are plural alignment marks formed at plural locations on every shot on the wafer. For larger throughput and higher position detection precision, the alignment of the wafer as a whole with respect to the reticle is performed only once prior to the exposure, and, subsequently, the wafer is mechanically positioned in a step-and-repeat method in accordance with the design value of a shot layout upon the wafer (i.e., global alignment method).

In this embodiment, an atomic force microscope 68 for measuring the surface shape of the wafer 65 is provided adjacent to the reduction projection lens 62, and it serves to detect the surface shape of an alignment mark portion defined on the wafer 65, which is placed on the movable stage 66 whose position is controlled by means of an interferometer 67. More exactly, the surface position of a resist on the alignment mark is measured by the AFM.

In the surface shape measurement, a probe of the atomic force microscope 68 for tracing the surface of the alignment mark portion traces the surface while moving upwardly and downwardly, intermittently, along a direction perpendicular to the surface of the substrate. Also, the force to be applied by the tracing probe to the surface of the step (level difference) pattern is made not greater than 10 nN.

Next, an alignment method with regard to the alignment mark, in this embodiment, will be described.

Figure 17:
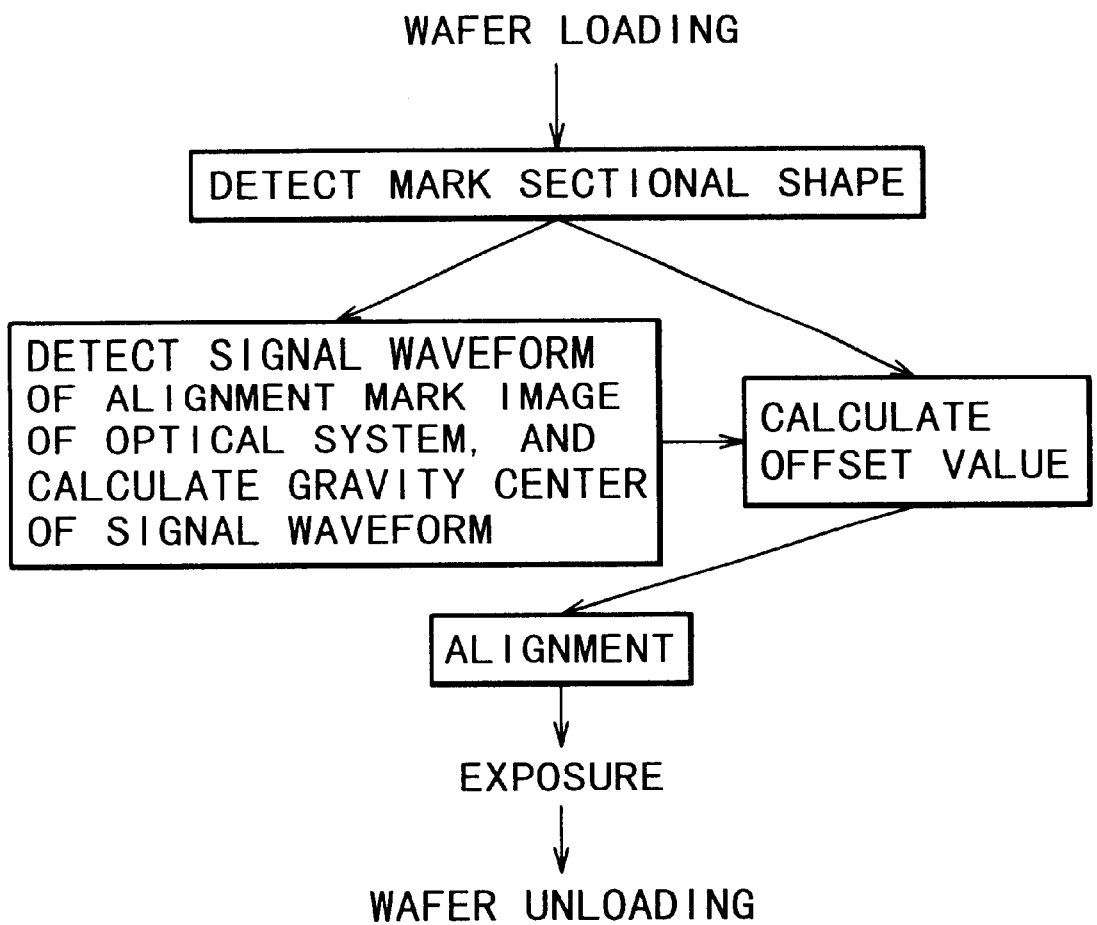
FIG. 17 is a flow chart for explaining an alignment method according to an embodiment of the present invention.

As a wafer 65 is placed on the movable stage 66 whose position is controlled through the interferometer 67, as shown in the flow chart of FIG. 17, the atomic force microscope 68 detects the sectional shape of an alignment mark or marks of each shot, being formed with a recessed shape or protruded shape. Upon completion of the detection of the sectional shape of the mark or marks in relation to a predetermined shot, the stage 66 is driven and the position detection for the mark through an optical system is performed. As regards the position detecting method using the optical system, light emitted from an alignment illumination system, having a light source of non-exposure light such as a He—Ne laser, for example, is projected to illuminate a mark, formed on the wafer 65, which is placed on the stage 66, being movable in the X, Y and Z directions. Reflected light or scattered light from the mark goes again through the alignment optical system, and it forms an image of the mark upon the CCD camera. A signal detected by the CCD camera is image-processed, whereby a gravity center of the signal waveform is detected. Here, a signal detected by the optical system is applied to a CPU, so that, from the sectional shape of the alignment mark as detected by the atomic force microscope 68, an offset value is calculated. By subtracting this offset value from the gravity center value determined from the signal detected by the optical system, a true central position of the alignment mark can be detected. On the basis of this detected value, the stage 66 is then moved to accomplish the wafer 65 alignment.

In the structure described above, when the sectional shape of the resist surface adjacent to an alignment mark on a wafer surface is asymmetrical and, particularly, even if there are a location of a shape nearly symmetrical and a location of a shape not at all symmetrical, mixed, by subtracting a corresponding offset value obtained by the surface shape measuring mechanism from the gravity center of the signal waveform having been detected from the image taken by the image pickup means in accordance with the image of the alignment mark, the influence of refraction attributable to non-uniformness of resist film thickness at the corresponding location, can be avoided. Thus, even in an alignment method wherein the central position of an alignment mark is detected on the basis of the symmetry of the waveform, there is no deterioration of detection precision or no decrease of alignment precision.

As regards the surface shape measuring mechanism, when an atomic force microscope 68 is used therefor, the addition of the same to an alignment system of a conventional structure is easy. Further, the surface shape of a resist can be measured quickly and very precisely. Moreover, any adverse affect being influential to succeeding processes is not applied to the resist surface.

Figure 18:
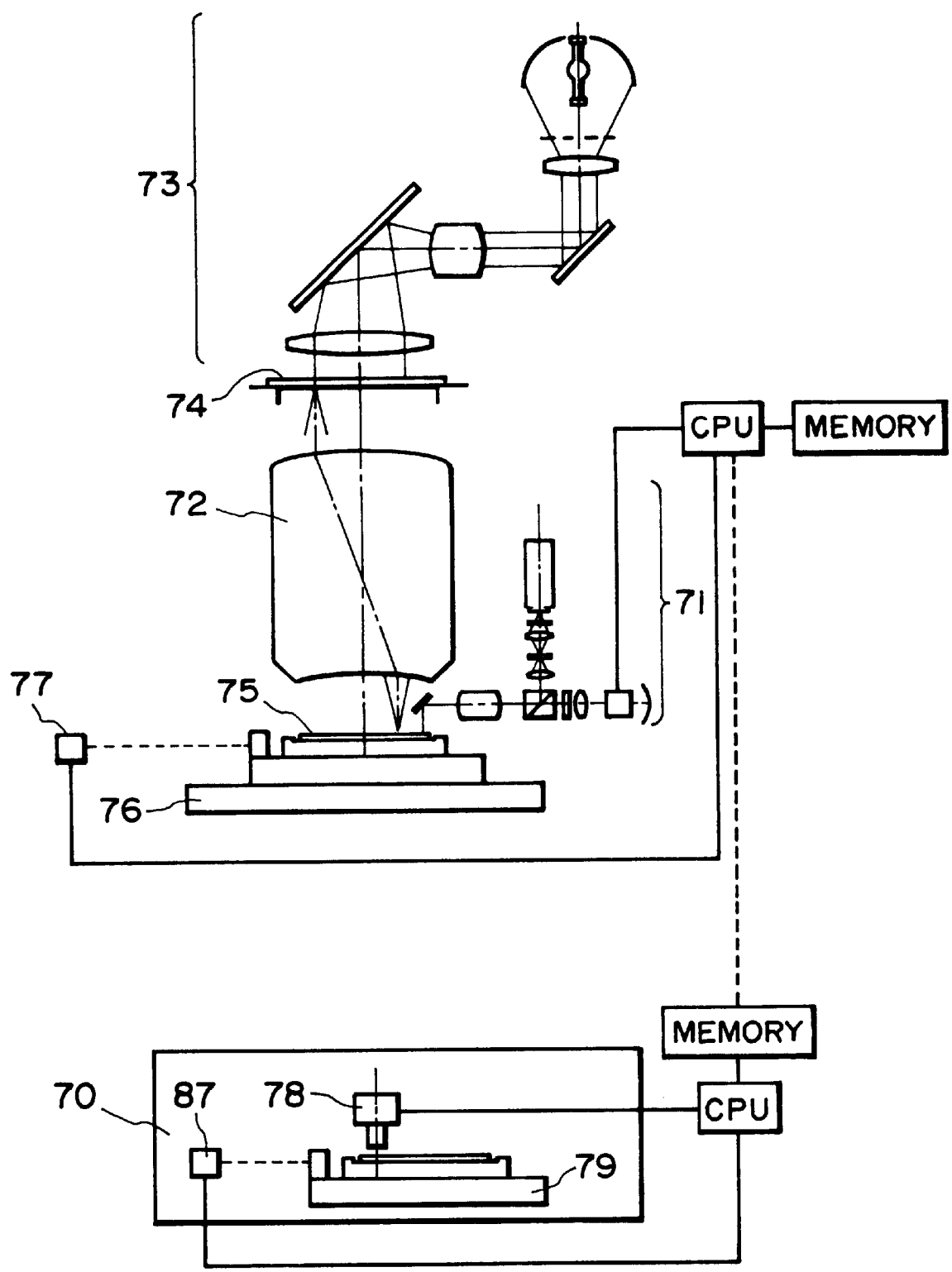
FIG. 18 is a schematic view of an exposure apparatus according to another embodiment of the present invention.

Next, a sixth embodiment of the present invention will be described with reference to FIG. 18.

A semiconductor exposure apparatus in this embodiment is based on an alignment method and an alignment system according to the present invention, and, as in the fifth embodiment, it is arranged so that: a circuit pattern formed on a reticle 74, which is placed at a predetermined position above a reduction projection lens 72 is illuminated with an exposure illumination system 73, such that the circuit pattern is projected sequentially onto pattern regions upon a wafer 75, which is placed on a movable stage 76 below the reduction projection lens 72, whereby images of the circuit pattern are transferred to these pattern regions on the wafer 75. An alignment detection system 71 has a similar structure as that of the fifth embodiment, and it comprises a mechanism for illuminating an alignment mark formed on the wafer, and an image pickup device such as a CCD, for example, for taking an image of the alignment mark as illuminated. It is disposed adjacent to the reduction projection lens 72, and operates to detect the position of an alignment mark placed on a scribe line (not shown) upon the wafer 75.

Alignment marks on the wafer as well as the method of detecting and positioning them are similar to those of the fifth embodiment, and a global alignment method is used similarly.

In this embodiment, a surface shape detecting system 70, which comprises an atomic force microscope 78 for detecting the surface shape of the wafer 75 and a movable stage 79 whose position is controlled through an interferometer 87, for example, as well as a CPU for calculating an offset value and a memory for recording the calculated offset value therein, are all disposed outside an exposure apparatus including the reduction projection system and the alignment detecting system.

In the surface shape measurement for a step (level difference) pattern described above, a probe of the atomic force microscope 78 for tracing the surface of the alignment mark portion traces the surface while moving upwardly and downwardly, intermittently, along a direction perpendicular to the surface of the substrate. Also, the force to be applied by the tracing probe to the surface of the step (level difference) pattern is made not greater than 10 nN.

Next, an alignment method with regard to the alignment mark, in this embodiment, will be described.

Figure 19:
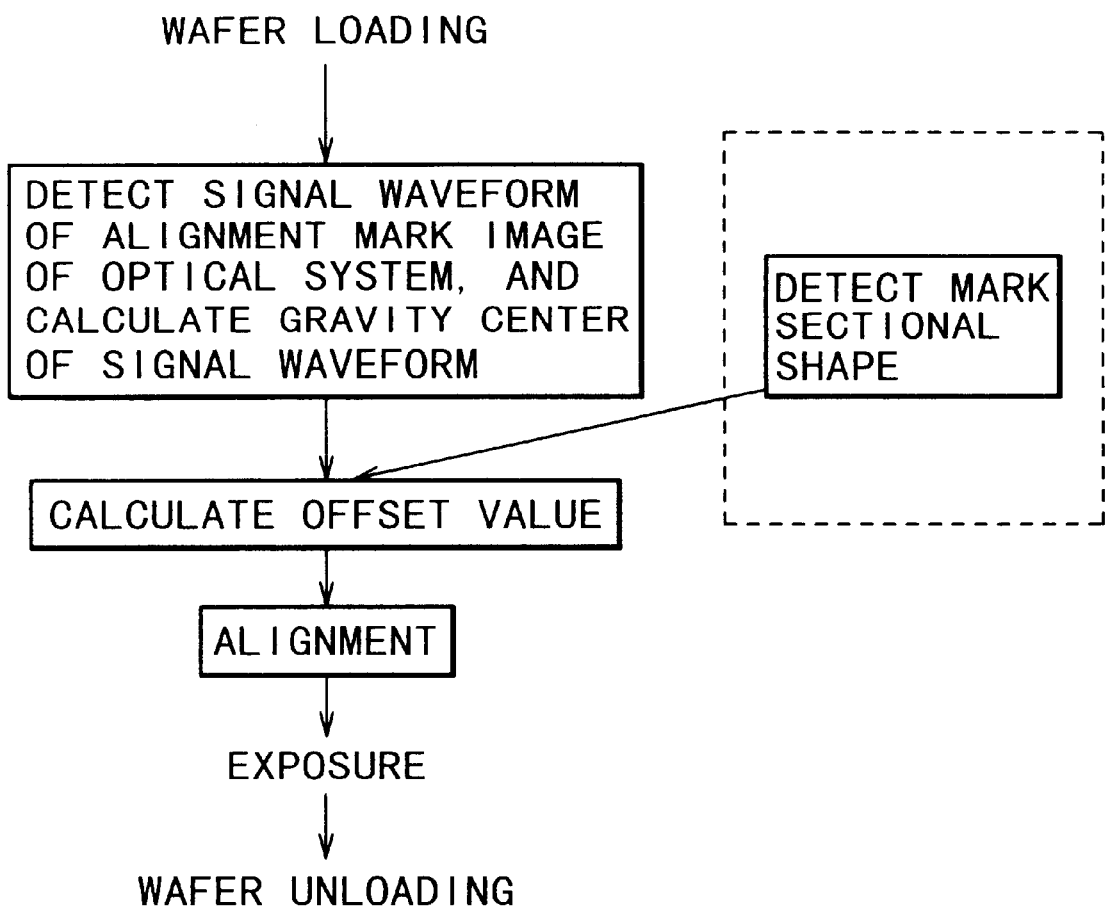
FIG. 19 is a flow chart for explaining an alignment method according to another embodiment of the present invention.

In this embodiment, as shown in the flow chart of FIG. 19, detection of the mark sectional shape is performed by use of the surface shape detecting system 76 beforehand. The result is once stored in the memory as alignment mark information related to respective wafers. In the exposure process using the exposure apparatus, as a wafer 75 is placed on the movable stage 76 whose position is controlled through the interferometer 77, the gravity center value of a detection signal is calculated on the basis of the image having been detected by the image pickup means in accordance with the image of the alignment mark. The detection of the gravity center through the optical system is made in a similar manner as that of the fifth embodiment. Here, the signal detected by the optical system is transmitted to the CPU, and an offset value is calculated from the sectional shape of a corresponding wafer alignment mark having been recorded in the memory. The offset calculation for the mark is similar to that of the fifth embodiment. By subtracting this offset value from the gravity center value determined from the signal detected by the optical system, a true central position of the alignment mark can be detected. On the basis of this detected value, the stage 76 is then moved to accomplish the wafer 75 alignment.

In the structure described above, when the sectional shape of the resist surface adjacent to an alignment mark on a wafer surface is asymmetrical and, particularly, even if there are a location of a shape nearly symmetrical and a location of a shape not at all symmetrical, mixed, by subtracting a corresponding offset value obtained by the surface shape measuring mechanism from the gravity center of the signal waveform having been detected from the image taken by the image pickup means in accordance with the image of the alignment mark, the influence of refraction attributable to non-uniformness of the resist film thickness at the corresponding location, can be avoided. Thus, even in an alignment method wherein the central position of an alignment mark is detected on the basis of the symmetry of the waveform, there is no deterioration of detection precision or no decrease of alignment precision.

As regards the surface shape measuring mechanism, when an atomic force microscope is used therefor, the surface shape of a resist can be measured quickly and very precisely. Moreover, any adverse affect being influential to succeeding processes is not applied to the resist surface.

Further, the surface shape detecting system is placed outside the exposure apparatus, and the information related to the wafer alignment mark shape is once recorded. This eliminates the necessity of performing the surface shape detection for wafers at the time of exposure and alignment operation in an exposure apparatus. Therefore, it does not decrease the throughput.

While the present invention has been described with reference to some embodiments, the present invention is not limited to a semiconductor manufacturing apparatus. It can be applied also to a method or apparatus for observing or positioning a fine structure covered by a thin transparent film, for example.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for printing a pattern of a first object on a second object coated with a resist, comprising:

storing means for storing an alignment offset value related to an alignment mark forming region on the second object, after formation of the resist coating thereon; and an alignment system for aligning the first object with the second object coated with the resist, on the basis of the offset value;

wherein the alignment offset value is determined on the basis of (i) information regarding a surface shape of the second object before formation of the resist coating thereon and (ii) information regarding a surface shape of the resist coating formed on the second object.

2. An apparatus according to claim 1, further comprising an offset analyzer disposed outside said exposure apparatus, wherein the alignment offset value is produced by use of the offset analyzer.

3. An apparatus according to claim 1, wherein said alignment system includes an alignment detection system for optically detecting the alignment mark without intervention of a projection optical system of said exposure apparatus, and by use of light of a wavelength different from exposure light used for the pattern transfer.

4. An apparatus according to claim 1, wherein the alignment offset value is produced on the basis of a result of shape measurement made through a measuring mechanism included in said exposure apparatus.

5. An apparatus according to claim 2, wherein said offset analyzer comprises an atomic force microscope.

* * * * *